(12) United States Patent
Higashi et al.

(10) Patent No.: US 7,379,785 B2
(45) Date of Patent: May 27, 2008

(54) SUBSTRATE PROCESSING SYSTEM, COATING/DEVELOPING APPARATUS, AND SUBSTRATE PROCESSING APPARATUS

(75) Inventors: Makio Higashi, Kumamoto (JP); Akira Miyata, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 387 days.

(21) Appl. No.: 10/536,976

(22) PCT Filed: Nov. 18, 2003

(86) PCT No.: PCT/JP03/14673

§ 371 (c)(1),
(2), (4) Date: May 31, 2005

(87) PCT Pub. No.: WO2004/049408

PCT Pub. Date: Jun. 10, 2004

(65) Prior Publication Data

US 2005/0287821 A1 Dec. 29, 2005

(30) Foreign Application Priority Data

Nov. 28, 2002 (JP) ............................. 2002-346138

(51) Int. Cl.
*G06F 19/00* (2006.01)
(52) U.S. Cl. ...................... 700/112; 700/121
(58) Field of Classification Search .................. 700/96, 700/100, 112, 121, 213; 438/780; 396/611
See application file for complete search history.

(56) References Cited

U.S. PATENT DOCUMENTS 5,803,932 A 9/1998 Akimoto 5,849,602 A 12/1998 Okamura
2001/0051837 A1 12/2001 Tateyama
2002/0009902 A1 1/2002 Hashiguchi

FOREIGN PATENT DOCUMENTS

| JP | 04-239720 A | 8/1992 |
| JP | 07-142356 A | 6/1995 |
| JP | 7-171478 A | 7/1995 |
| JP | 8-255750 A | 10/1996 |
| JP | 08-316130 A | 11/1996 |
| JP | 10-270316 A | 10/1998 |
| JP | 2001-77014 A | 3/2001 |
| JP | 2001-351848 A | 12/2001 |

OTHER PUBLICATIONS

International Search Report mailed on Mar. 23, 2004.

*Primary Examiner*—Zoila Cabrera
*Assistant Examiner*—Carlos Ortiz-Rodriguez
(74) *Attorney, Agent, or Firm*—Rader, Fishman & Grauer, PLLC

(57) ABSTRACT

In a coating and developing apparatus that forms a resist film on substrates such as semiconductor wafers, and develops substrates exposed by an aligner, times after the aligner unloads substrates until heating units (PEB) start heating the substrates are kept uniform. Exposed wafers are prevented from being left stagnant in an interface portion disposed between a region in which resist is coated and developed and the aligner. In the region in which resist is coated and developed, a first transferring means that successively executes transportation cycles to transfer substrates from upstream side modules to downstream side modules in a flow of processes of substrates. N heating units (PEB) are disposed (n is for example 5). Exposed wafers loaded into the heating units (PEB) are unloaded by the first transferring means after (n−1) cycles including the transferring cycle of the first transferring means have elapsed.

11 Claims, 16 Drawing Sheets

| PHASE | TRS | ADH | COT | LHP | TRS | <IFB> | PEB | PEB | PEB | PEB | PEB | DEV | TRS | UNC |
|---|---|---|---|---|---|---|---|---|---|---|---|---|---|---|
| 1 | A01 | | | | | | | | | | | | | |
| 2 | A02 | A01 | | | | | | | | | | | | |
| 3 | A03 | A02 | A01 | | | | | | | | | | | |
| 4 | A04 | A03 | A02 | A01 | | | | | | | | | | |
| 5 | A05 | A04 | A03 | A02 | A01 | | | | | | | | | |
| 6 | A06 | A05 | A04 | A03 | A02 | A01 | | | | | | | | |
| 7 | A07 | A06 | A05 | A04 | A03 | A01+1 | | | | | | | | |
| 8 | A08 | A07 | A06 | A05 | A04 | A01+2 | | | | | | | | |
| 9 | A09 | A08 | A07 | A06 | A05 | A01+3 | | | | | | | | |
| 10 | A10 | A09 | A08 | A07 | A06 | A02+3 | | | | | | | | |
| 11 | | A10 | A09 | A08 | A07 | A03+3 | | | | | | | | |
| 12 | | | A10 | A09 | A08 | A04+3 | | | | | | | | |
| 13 | | | | A10 | A09 | A05+3 | A01→ | | | | | | | |
| 14 | | | | | A10 | A06+3 | | A02→ | | | | | | |
| 15 | | | | | | A08+2 | | | A03→ | | | | | |
| 16 | | | | | | A09+1 | A06→ | | | A04→ | | | | |
| 17 | | | | | | A09+1 | | A07→ | | | A05→ | | | |
| 18 | | | | | | A010 | | | A08→ | | | A01 | | |
| 19 | | | | | | | | | | A09→ | | A02 | A01 | |
| 20 | | | | | | | | | | | A10→ | A03 | A02 | A01 |
| 21 | | | | | | | | | | | | A04 | A03 | A02 |
| 22 | | | | | | | | | | | | A05 | A04 | A03 |
| 23 | | | | | | | | | | | | A06 | A05 | A04 |
| 24 | | | | | | | | | | | | A07 | A06 | A05 |
| 25 | | | | | | | | | | | | A08 | A07 | A06 |

FIG.9

| PHASE | C | TRS1 | ADH-1 | ADH-2 | COL1-1 | COL1-2 |
|---|---|---|---|---|---|---|
| 1 | W1 | | | | | |
| 2 | W2 | W1 | | | | |
| 3 | W3 | W2 | W1 | | | |
| 4 | W4 | W3 | | W2 | | |
| 5 | W5 | W4 | W3 | | W1 | |
| 6 | W6 | W5 | | W4 | | W2 |

FIG.10

| PHASE | <IFB> | PEB | PEB | PEB | PEB | PEB | DEV |
|---|---|---|---|---|---|---|---|
| 2 | A01 | | | | | | |
| 3 | A01+1 | | | | | | |
| 4 | A01+2 | | | | | | |
| 5 | A02+2 | A01 | | | | | |
| 6 | A03+2 | | A02 | | | | |
| 7 | A04+2 | | | A03 | | | |
| 8 | A05+2 | | | | A04 | | |
| 9 | A06+2 | | | | | A05 | |
| 10 | A07+1 | A06 | | | | | A01 |
| 11 | A08 | | A07 | | | | A02 |
| 12 | ↓ | | | | | | A03 |
| 13 | | | | A08 | | | A04 |
| 14 | | | | | | | A05 |
| 15 | | | | | | | A06 |
| 16 | | | | | | | A07 |
| 17 | | | | | | | |
| 18 | | | | | | | A08 |

FIG.11

SUBSTRATE PROCESSING SYSTEM, COATING/DEVELOPING APPARATUS, AND SUBSTRATE PROCESSING APPARATUS

BACKGROUND OF THE INVENTION

1. Field of the Invention

The present invention relates to a coating and developing apparatus of which a processing unit processes a substrate such as a semiconductor wafer or a liquid crystal display glass substrate (an LCD substrates), one transferring means transfers the substrate to another transferring means through a processing unit, and the other transferring means transfers the substrate to a plurality of downstream processing units. For example, the present invention relates to a coating and developing apparatus that forms a resist film on a substrate and performs a developing process for the exposed substrate, in particular to a transferring technology of an interface portion that is disposed between the apparatus and an aligner and that transfers an exposed substrate to a region in which a developing process is performed.

2. Description of the Related Art

In a manufacturing process for semiconductor devices and LCD substrates, a resist coating process is preformed for substrates using a technology called the photolithography. In this technology, a resist solution is coated on for example a semiconductor wafer (hereinafter referred to as a wafer) as a liquid film. With a photo mask, the resist film is exposed. Thereafter, a developing process is performed for the resultant substrate. As a result, a desired pattern is formed on the substrate. The photolithography technology is accomplished by a series of these processes.

A system that integrates a coating and developing apparatus that performs those processes and an aligner has been known. FIG. 14 is a schematic plan view showing such an integrated system. FIG. 15 is a schematic side view showing a part of the integrated system. FIG. 16 is a schematic diagram describing a transportation path of wafers W in the integrated system. A coating and developing apparatus 1 is composed of a carrier mounting portion 1A on which many carriers C are placed, a processing block 1B disposed on the far side of the carrier mounting portion 1A, and an interface portion 1C. An aligner 1D is connected to the coating and developing apparatus 1 through the interface portion 1C. Disposed in the carrier mounting portion 1A is a transferring arm 11 that transfers wafers W contained in carriers C to the processing block 1B. Disposed in the processing block 1B are a main transferring arm 12 and rack units 13 (13a, 13b, and 13c). The main transferring arm 12 has for example three arms that are capable of advancing and retreating, raising and lowering, and rotating in the horizontal direction. The rack units 13 are disposed on the near side, the left side, and the far side of the main transferring arm 12 viewed from the carrier mounting portion 1A. The rack units 13 have heating units and cooling units that are multiply tiered. The cooling units are accurately temperature controlling units. Disposed on the right side of the main transferring arm 12 viewed from the carrier mounting portion 1A is a liquid processing unit 14. The liquid processing unit 14 has a coating unit (COT) and a developing unit (DEV).

Disposed in for example the rack units 13a to 13c are transferring units (TRS1 to TRS3), a hydrophobic processing unit (ADH), a bake unit, and so forth. The transferring units (TRS1 to TRS3) transfer wafers W between the carrier mounting portion 1A and the processing block 1B, among the rack units 13a to 13c, and between the processing block 1B and the interface portion 1C. The baking unit performs a heating process for wafers W that have been exposed.

Disposed in the interface portion 1C are for example an accurate temperature controlling unit (CPL), a periphery aligner (WEE), and a buffer cassette (SBU). A transferring arm 15 that transfers wafers W among these modules and between each of these modules and the processing block 1B is disposed. The transferring arm 15 is capable of advancing and retreating, raising and lowering, and rotating in the horizontal direction. In addition, the transferring arm 15 is capable of accessing a loading stage 16 and an unloading stage 17 disposed in for example the interface unit 1C. Thus, the transferring arm 15 is capable of transferring wafers W between the interface portion 1C and the aligner 1D.

In the foregoing system, a wafer W contained in a carrier C placed on the carrier mounting portion 1A is loaded into the processing block 1B through the transferring arm 11. The coating unit (COT) coats a resist solution on the wafer W. Thereafter, the wafer W is transferred to the interface portion 1C and the aligner 1D in these orders. The aligner 1D exposes the wafer W. After the wafer W has been exposed, the wafer W is transferred to the developing unit (DEV) of the processing block 1B in the reverse path. The developing unit (DEV) develops the wafer W. Thereafter, the wafer W is returned to the carrier mounting portion 1A through the transferring arm 11. Before and after the coating and developing processes are performed for the wafer W, a pre-process and a post-process such as a heating process and a cooling process are performed in the rack units 13 (13a, 13b, and 13c) for the wafer W.

To perform the foregoing processes for a wafer W, a path is pre-programmed. Next, with reference to FIG. 16, an example of the path will be described. In FIG. 16, PAB represents a pre-baking unit, PEB represents a post-exposure baking unit, and POST represents a post-baking unit (post-development baking unit). As shown in FIG. 16, a wafer W is transferred from a carrier C to the processing block 1B by the transferring arm 11. Thereafter, the main transferring arm 12 transfers the wafer W to the TRS1, the ADH, the COT, the PAB, and the TRS2 in their order. Thereafter, the transferring arm 15 transfers the wafer W to the TRS2, the CPL3, the WEE, the SBU, and the loading stage 16 in their order. After the wafer W is processed in the ADH, in reality, a temperature controlling process is preformed for the wafer W. However, due to the limited space of the drawing, the temperature controlling process is omitted. After the aligner 1D performs an exposing process for the wafer W, it is transferred to the unloading stage 17 and the TRS3 in their order by the transferring arm 15. Thereafter, the wafer W is transferred to the TRS3, the PEB, the CPL, the DEV, the POST, and the CPL in their order by the main transferring arm 12 and then returned to the carrier C by the transferring arm 11.

A transportation schedule that describes timings all wafers of the lot are transferred to modules is stored in a memory. When the transferring arm 11 and the main transferring arm 12 are referred to as the transferring system, it transfers wafers W to the TRS1, the ADH, the COT, the PAB, the TRS2, the TRS3, the PEB, the CPL, the DEV, the POST, and the CPL in their order as denoted by dotted lines shown in FIG. 16. A coating and developing apparatus that takes out a wafer W from a carrier (cassette) and successively transfers it to processing units is disclosed in Japanese Patent Laid-Open Publication No. 2001-351848 (paragraph 0003 and paragraphs 0093 to 0099) issued by Japan Patent Office.

When lots are changed, if it takes a long time to replace reticles and change parameters or an alarm takes place in the aligner 1D, a wafer may not be unloaded from the aligner 1D for a time being. Thus, after reticles are changed, wafers may be unloaded from the aligner 1D. However, since the main transferring arm 12 transfers wafers W in accordance with the schedule, after the main transferring arm 12 receives one exposed wafer from the TRS3 and transfers the wafer to the PEB, the main transferring arm 12 cannot be returned. Thus, although the wafer has been exposed, it is left on the unloading stage of the aligner 1D until the main transferring arm 12 transfers the wafer to the PEB in the next cycle.

Thus, the time after the wafer is exposed until it is heated (pre-heat elapse time) becomes longer than the pre-heat elapse time for each of other wafers. To obtain desired pattern line widths, parameters such as exposure time, exposure amount, heating temperature and heating time in the PEB, and so forth are predetermined. At this point, the pre-heat elapse time is also predetermined. When a chemically amplifying resist is used for fine patterns, it is thought that after the resist is exposed, the pre-heat elapse time adversely affects the result of the developing process. Thus, if the pre-heat elapse times for wafers vary, as pattern line widths are miniaturized, their uniformity lowers. As a result, the yield of the final products may deteriorate.

When an exposed wafer is left stagnant in the interface portion 1C, the aligner 1D becomes incapable of exposing the wafer. Thus, the throughput of the aligner cannot be fulfilled. To prevent this problem, a buffer may be disposed in the interface portion 1C. However, in this case, the number of transferring processes becomes large. As a result, the throughput of the entire system cannot be fulfilled.

SUMMARY OF THE INVENTION

In view of the foregoing, it would be desirable to provide an apparatus of which a processing unit processes a substrate, a transferring means transfers the wafer to another processing unit, and another transferring means transfers the wafer to a plurality of downstream processing units, in particular, to keep times after one processing unit processes substrate until another process is performed for them uniform and prevent substrates from being left stagnant. In addition, it would be desirable to provide a coating and developing apparatus that allows times after substrates are exposed until they are transferred to heating units through an interface portion uniform, prevents the exposed substrates from being left stagnant, and the throughput thereof to be fulfilled.

An aspect of the present invention is a substrate processing system for a substrate processing apparatus having two transferring means, a transfer processing unit, and a plurality of processing units, the transfer processing unit functioning as a transferring portion, the two transferring means transferring a substrate processed by a processing apparatus to the processing units through the transfer processing unit, the system having n number of transfer processing units that perform a predetermined process for substrates processed by the processing apparatus (where n is any integer that is 2 or larger), first transferring means for successively executing transportation cycles to successively and individually transfer substrates from modules that are positions at which substrates are placed to downstream modules so as to successively and individually take out substrate from the transfer processing units and transfer the substrates to the processing units, second transferring means for successively and individually transferring substrates processed by the processing apparatus to the transfer processing units, and a controlling portion that controls the first transferring means to successively and individually unload substrates from the transfer processing units after (n−m) cycles including the current transportation cycle have elapsed (where m is any integer that is 1 or larger and smaller than n).

According to an aspect of the present invention, when one transportation cycle of the first transferring means is executed, even if (m+1) substrates are successively unloaded from a processing unit, since (m+1) transfer processing units are idle, the substrates can be loaded into the transfer processing units by the second transferring means, not left stagnant. Thus, times after the substrates are processed by the processing unit until the next process is performed can be kept uniform and the substrates can be prevented from being left stagnant.

As another aspect of the present invention, the substrate processing system may have means for adjusting times after the processing apparatus unloads substrates until the transfer processing units start processing the substrates to a predetermined time. In this case, the predetermined time can be matched with the maximum transportation time of wafers. Since the substrates can be prevented from being left stagnant, the maximum transportation time is very small. Thus, the substrates can be smoothly transferred. In addition, times after the substrates are processed by a processing unit until the next process is performed can be accurately adjusted.

Another aspect of the present invention is a coating and developing apparatus for a substrate processing unit that coats a resist solution on substrates and performs a developing process for substrates that have been exposed by an aligner, the apparatus having a plurality of processing units that perform a sequence of processes to form a resist film on the substrates, a plurality of processing units that successively perform a sequence of processes to perform a developing process for substrates that have been exposed, an interface portion disposed between a region of the group of the processing units that forms the resist film and the group of the processing units that performs the developing process and the aligner, a first transferring portion that transfers substrates on which the resist film has been formed to the interface portion, n number of heating units that perform a heating process for exposed substrates and that also function as second transferring portions (where n is any integer that is 2 or larger), a carrier mounting portion that holds a carrier that contains a plurality of substrates, first transferring means for successively and individually receiving substrates from a carrier held on the carrier mounting portion, transferring the substrates to the processing units that form the resist film on the substrates and a first transferring portion, receiving exposed substrates exposed by the aligner from the heating units, transferring the exposed substrates to the processing units that perform the developing process for the exposed substrates and the carrier held on the carrier mounting portion, and successively executing transportation cycles to transfer substrates from modules that are positions at which substrates are placed to downstream modules so as to take out substrate from the transfer processing units and transfer the substrates to the processing units, second transferring means, disposed in the interface portion, for successively and individually receiving substrates from the first transferring portion, transferring the substrates to the aligner, and transferring substrates exposed by the aligner to the heating units, and a controlling portion that controls the first transferring means to successively and individually unload substrates from the heating units after (n−m) cycles including the current transportation cycle have elapsed (where m is any integer that is 1 or larger and smaller than n).

The heating units may each have a heating plate that heats a substrate, a cooling plate that cools a substrate heated by the heating plate, and means for transferring a substrate between the heating plate and the cooling plate.

Another aspect of the present invention is a substrate processing apparatus that is capable of transferring a plurality of substrates with an aligner and performing a predetermined process for the substrates, the apparatus having a first processing unit that performs a first process for substrates, a second processing unit that performs a second process for substrates exposed by the aligner, the second process being different from the first process, a plurality of third processing units that perform a third process for substrates, the third process being different from the first process and the second process, a first transferring mechanism that transfers substrates among the first processing unit, the second processing unit, and the third processing units, a second transferring mechanism that transfers substrates among the aligner and the third processing units, and a controlling portion that independently controls the first transferring mechanism and the second transferring mechanism to transfer substrates.

According to another aspect of the present invention, the controlling unit is capable of independently controlling the first transferring mechanism and the second transferring mechanism. In addition, the controlling unit is capable of synchronously controlling for example the second transferring mechanism and the aligner. Thus, when the third processing units perform a third process and the first transferring mechanism cannot unload in time a substrate for which the third process has been performed, exposed substrates can be transferred to the third processing units. In addition, since there is a plurality of third processing units, even if the first transferring mechanism largely delays transferring a substrate, exposed substrates can be successively transferred to the third processing units.

The first process includes a resist coating process for substrates. The second process includes a developing process. The third process includes for example a heating process for exposed substrates.

As another aspect of the present invention, the controlling portion may control the first transferring mechanism to unload substrates from the third processing units before the sum of the number of substrates loaded into the third processing units, the number of substrates transferred by one of the first processing unit, the aligner, and the third processing units, and the number of substrates processed by the first processing unit and the aligner becomes equal to the number of the third processing units. Thus, exposed substrates can be buffered in the third processing units and exposed substrates can be transferred, not left stagnant.

As another aspect of the present invention, the second transferring mechanism may have a main transferring mechanism capable of transferring substrates to the third processing units, and a sub transferring mechanism capable of receiving substrates exposed by the aligner. The controlling portion may independently control the main transferring mechanism and the sub transferring mechanism to transfer the substrates. Thus, the main transferring mechanism and the sub transferring mechanism share transportation. In other words, while for example the main transferring mechanism is transferring a first substrate that has not been exposed, for example the sub transferring mechanism is capable of quickly unloading a second substrate from the aligner.

As another aspect of the present invention, the substrate processing apparatus may also have means for controlling wait times after the aligner exposes substrates until the third processing units start performing the third process for the substrates to keep them uniform. Thus, the third process can be performed for individual substrates at the same timing. Consequently, the wiring pattern line widths of individual substrates can be uniform.

As another aspect of the present invention, the wait times may be times of which real transportation times after the aligner exposes substrates until the substrates are transferred to the third processing units are subtracted from the sum of the maximum value of times after the aligner exposes the substrates until the substrates are received by the second transferring mechanism and the minimum value of times after the second transporting mechanism receives the exposed substrates until the substrates are transferred to the third processing unit.

The maximum value of times after the aligner expose wafers until the second transferring mechanism receives the wafers can be pre-designated with for example process times of the individual processing units. In addition, times after the second transferring mechanism receives exposed wafers until they are transferred to the third processing units can be pre-designated with for example the transportation speed and the transportation distance of the second transferring mechanism, and so forth. Thus, when the real transportation times are measured, the wait times can be obtained.

As another aspect of the present invention, at least one of the main transferring mechanism and the sub transferring mechanism may have a first transferring member that transfers substrates, and a second transferring member that is movable integrally with the first transferring member and that is capable of transferring substrates. Thus, substrates can be left and other substrates can be smoothly transferred. When exposed substrates are successively unloaded from for example the aligner, if the exposed substrates are left in the first transferring member and the second transferring member, the substrates can be buffered and other substrates can be smoothly transferred.

As another aspect of the present invention, the substrate processing apparatus may also have a buffering unit that is disposed between the aligner and the third processing units and that buffers substrates to keep times after the aligner exposes substrates until the third processing units start performing the third process for the substrates uniform. Thus, exposed substrates can be temporarily buffered in the buffering unit. Consequently, times after the aligner exposes the substrates until the third processing units start the third process for the substrate can be uniform.

These and other objects, features and advantages of the present invention will become more apparent in light of the following detailed description of a best mode embodiment thereof, as illustrated in the accompanying drawings.

BRIEF DESCRIPTION OF DRAWINGS

The invention will become more fully understood from the following detailed description, taken in conjunction with the accompanying drawing, wherein similar reference numerals denote similar elements, in which:

FIG. 9 is a schematic diagram describing an example of a transportation schedule created by the controlling unit.

FIG. 10 is a schematic diagram describing an example of a transportation schedule created by the controlling unit.

FIG. 11 is a schematic diagram describing an example of a transportation schedule for a comparison.

DESCRIPTION OF PREFERRED EMBODIMENTS

Figure 1:
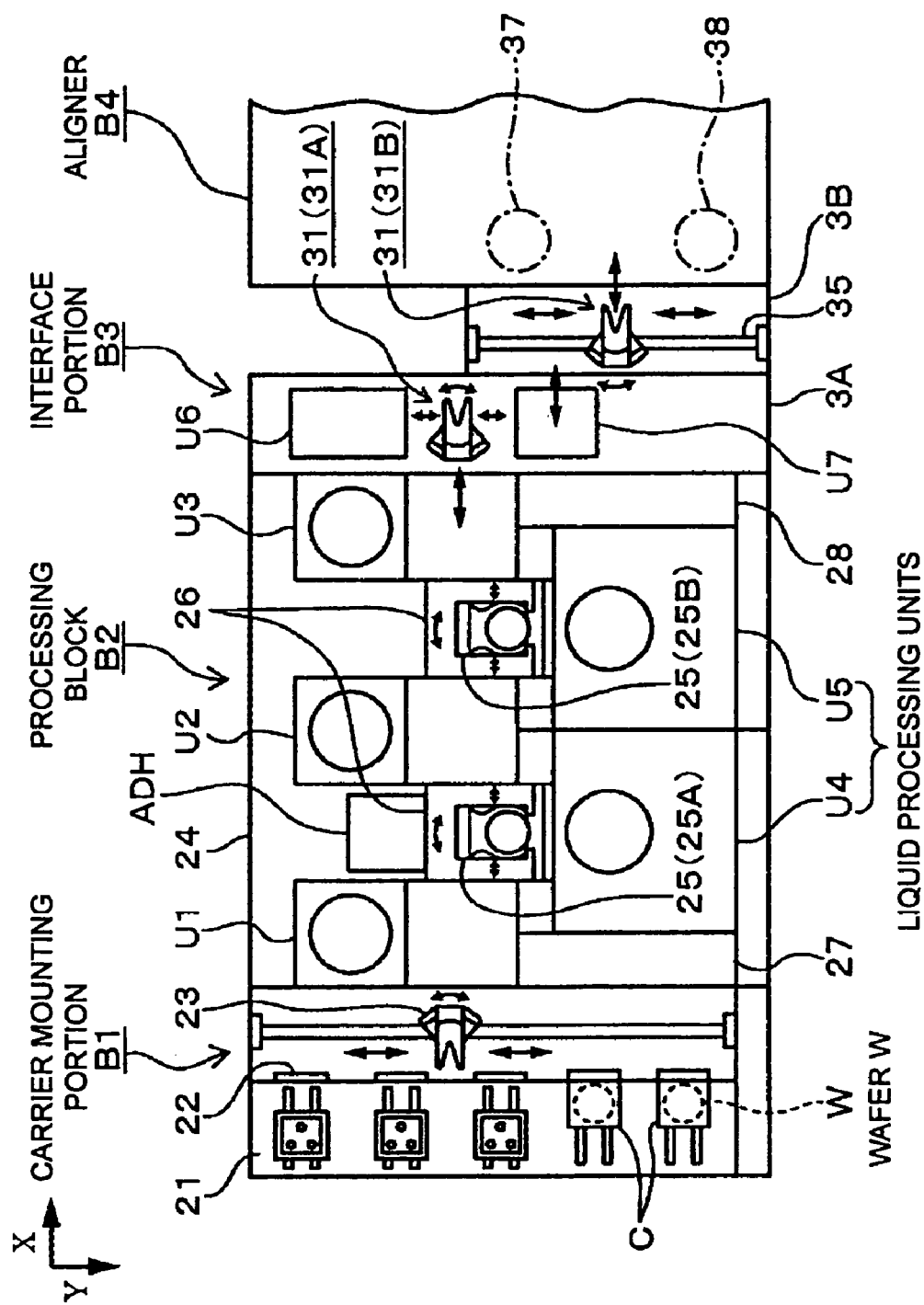
FIG. 1 is a plan view showing a coating and developing apparatus according to an embodiment of the present invention.
Figure 2:
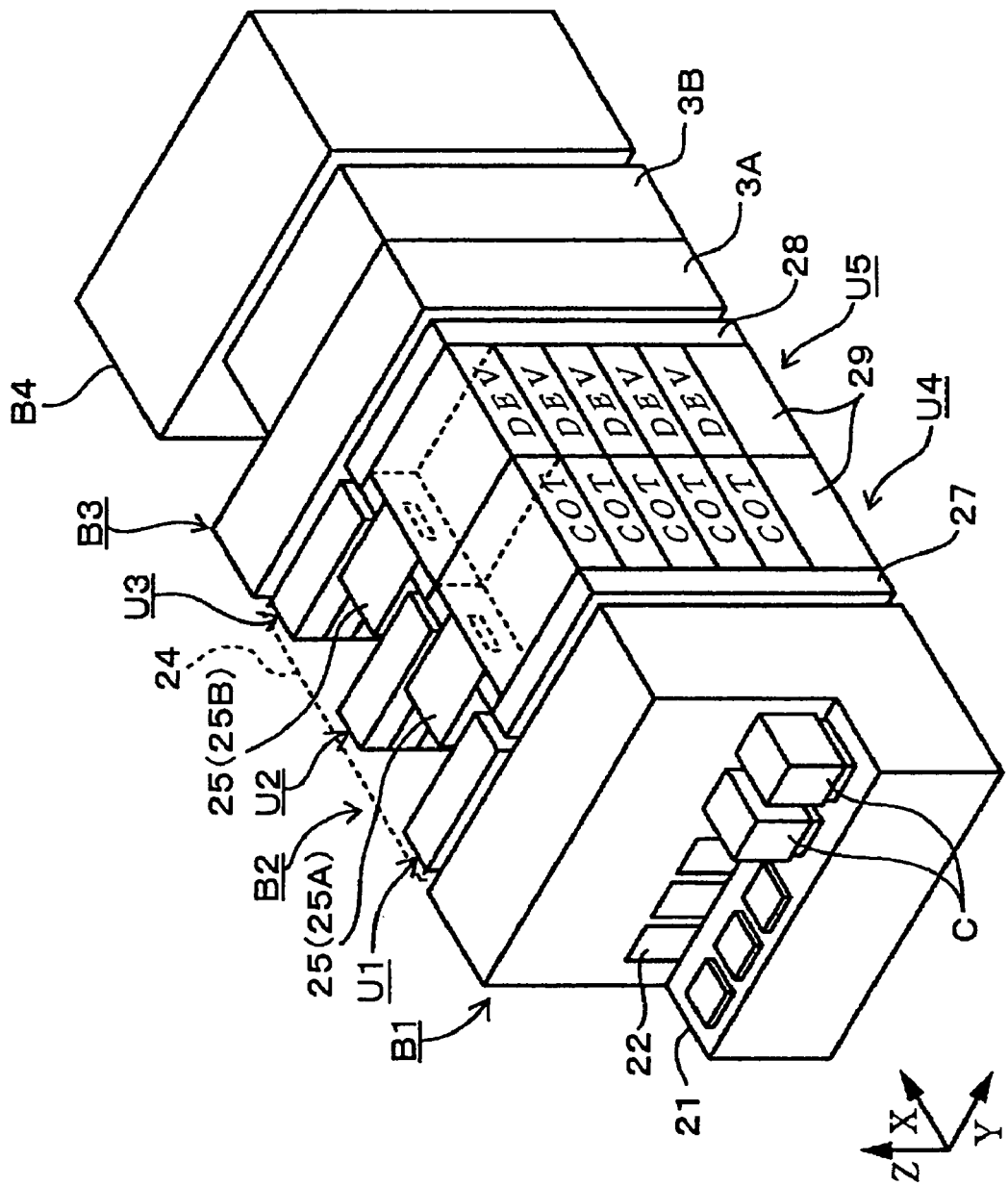
FIG. 2 is a perspective view showing the coating and developing apparatus.

Next, a resist pattern forming apparatus to which a substrate processing system according to an embodiment of the present invention is applied will be described. The resist pattern forming apparatus as the coating and developing apparatus according to the embodiment of the present invention is composed of the coating and developing apparatus and an aligner. FIG. 1 is a plan view showing a resist pattern forming apparatus according to the embodiment. FIG. 2 is a perspective view showing the resist pattern forming apparatus. In these drawings, B1 represents a carrier mounting portion to and from which carriers C each of which airtightly contains for example 13 wafers W as workpieces are loaded and unloaded. The carrier mounting portion B1 has a table 21 on which a plurality of carriers can be placed, an open/close portion 22 formed disposed in a wall surface in the front of the table 21, and a transfer arm 23 that functions as a part of a first transferring means 1 that takes out a wafer W from a carrier C through the open/close portion 22.

Connected on the far side of the carrier mounting portion B1 is a processing block B2 surrounded by a housing 24. Alternately disposed in the processing block B2 are three rack units U1, U2, and U3 and main transferring mechanisms 25 (25A and 25B) viewed from the near side of the carrier mounting portion B1. The rack units U1, U2, and U3 have heating and cooling units tiered on multiple shelves. The main transferring mechanisms 25 (25A and 25B) are part of a first transferring means that transfers a wafer W among the units of the rack units U1, U2, and U3 and various types of units that will be described later and that is capable of advancing and retreating, rising and lowering, and rotating around the vertical axis. In other words, the rack units U1, U2, and U3 and the main transferring mechanisms 25 (25A and 25B) are arranged in a row viewed from the carrier mounting portion B1. Formed in each connecting member is an opening portion (not shown) through which a wafer is transferred. A wafer W can be freely transferred from the rack unit U1 on one side to the block unit U3 on the other end in the processing block B2. The main transferring mechanisms 25 (25A and 25B) are driven by a controller corresponding to a command received from a controlling portion that will be described later. In this example, the first transferring means is composed of the transfer arm 23 and the main transferring mechanisms 25 (25A and 25B).

The main transferring mechanisms 25 (25A and 25B) are disposed in a space surrounded by a side portion formed by the rack units U1, U2, and U3 disposed in the forward direction viewed from the carrier mounting portion B1, a side portion formed by liquid processing units U4 and U5 disposed on the right viewed from the carrier mounting portion B1, and a partition wall 26 that composes one surface on the left of the carrier mounting portion B1. The main transferring mechanisms 25 (25A and 25B) each have a plurality of arms (for example, three arms) that are capable of advancing and retreating, rising and lowering, and rotating in the horizontal direction. These plurality of arms are capable of independently advancing and retreating. Disposed on the left of the main transferring mechanism 25A (opposite to the liquid processing unit U4 through the main transferring mechanism 25A) are hydrophobic processing units (ADH) that are multi-tiered. Like the rack units U1, U2, and U3, the main transferring mechanism 25A is capable of accessing the interior of each of the hydrophobic processing units through their opening portions (not shown). In the drawings, reference numerals 27 and 28 represent temperature and humidity adjusting units each of which has a temperature controlling unit, a temperature and humidity adjusting duct, and so forth for process solutions used in each unit.

As shown in FIG. 2, disposed in each of the liquid processing units U4 and U5 are a storage portion 29 that store for example a coating solution (resist solution) and a developing solution and a plurality of coating units (COT) and developing units (DEV) that are multi-tiered (for example, five units are tiered). Each of the rack units U1, U2, and U3 is multi-tiered (for example, ten units are tiered) and has a plurality of types of units for pre-processes and post-processes performed in the liquid processing units U4 and U5. In FIG. 2, due to its limited drawing space, the hydrophobic processing units (ADH) are omitted.

Figure 3:
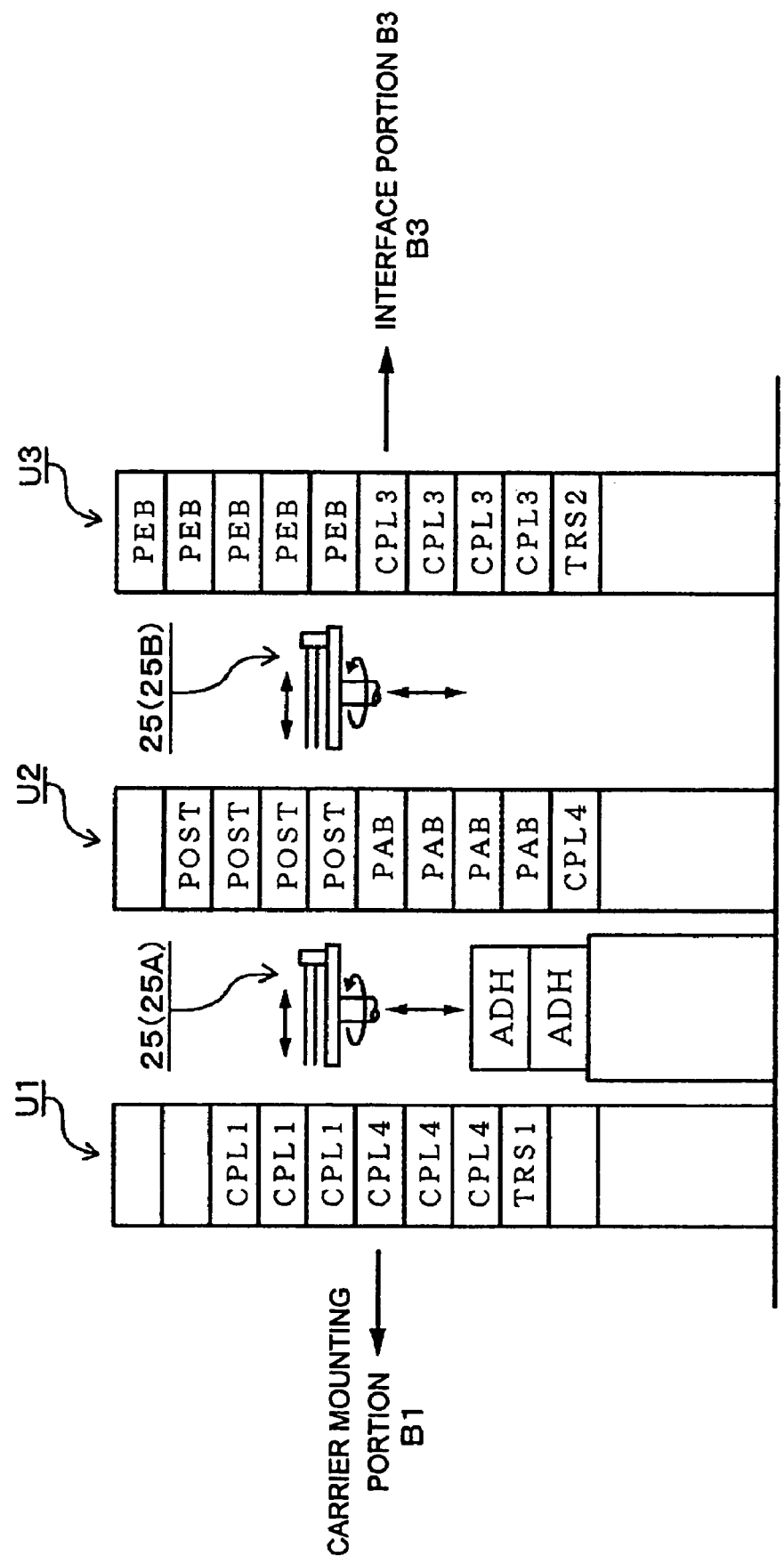
FIG. 3 is a side view showing structures of rack units of the coating and developing apparatus.

The units that perform the pre-processes and post-processes include a cooling unit (CPL1) that is a temperature controlling unit that adjusts the temperature of a wafer W processed in a hydrophobic processing unit (ADH) to a predetermined temperature before a resist solution is coated on the wafer W, a heating unit (PAB) called for example a pre-baking unit that performs a heating process for a wafer after the resist solution is coated on the wafer, a heating unit (PEB) called for example a post-exposure baking unit that performs a heating process for a wafer W that has been exposed, a cooling unit (CPL3) that is a temperature controlling unit that adjusts the temperature of a wafer W heated by the heating unit (PEB) to a predetermined temperature before a developing process is performed for the wafer W, a heating unit (POST) called for example a post-baking unit that performs a heating process for a wafer W after a developing process is performed for the wafer W, and a cooling unit (CPL4) that cools a wafer W heated by the heating unit (POST). FIG. 3 shows an example of a layout of these units. The heating units (PEB) are for example five-tiered. It should be noted that the layout shown in FIG. 3 is just an example. In the real apparatus, the number of units that are tiered is designated corresponding to the process times of the individual units and so forth. The rack units U1 and U3 have transferring units (TRS1) and (TRS2), respectively, as shown in FIG. 3. The transferring units (TRS1) and (TRS2) each have a transferring table that transfers a wafer W.

The heating units (PAB) and (POST) have heating plates that both the main transferring mechanisms 25A and 25B can access.

Figure 4:
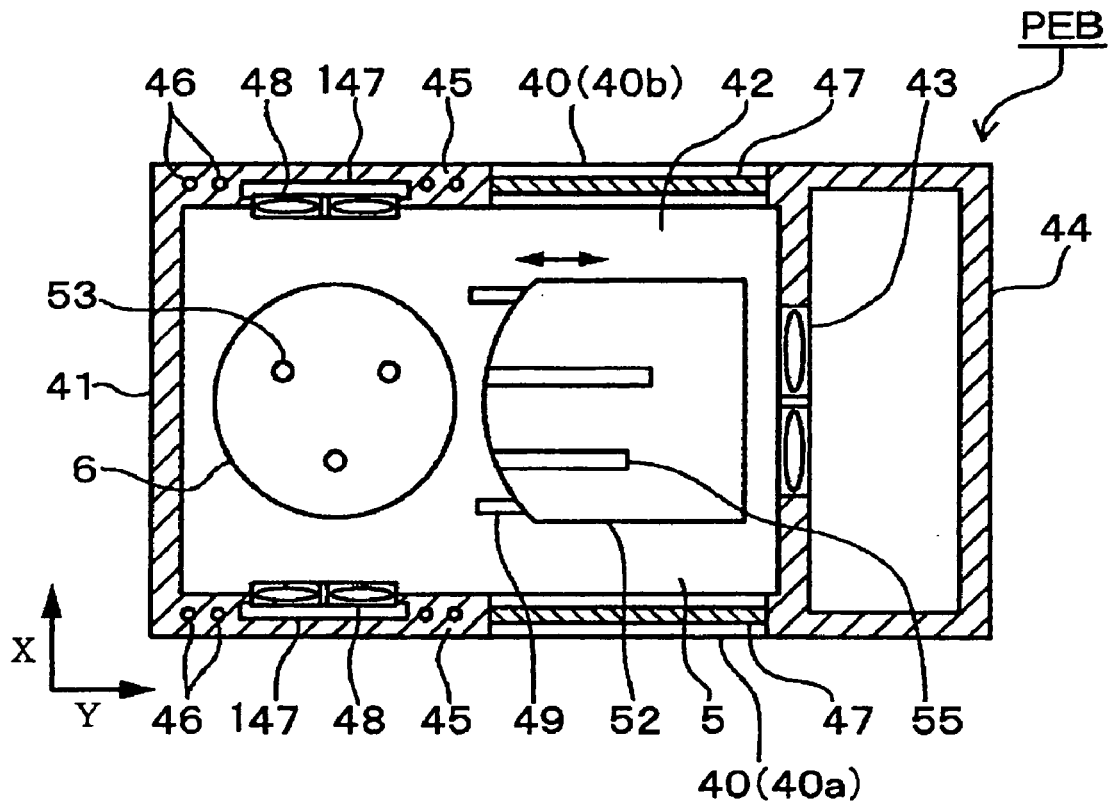
FIG. 4 is a plan view showing an example of a heating unit (PEB) that is one tier of the rack units.

The heating unit (PEB) that performs a heating process for a wafer W that has been exposed has a heating plate and a cooling plate that slightly cools the wafer W that has been heated. FIG. 4 shows a detailed structure of the heating unit (PEB). Disposed in a housing 41 is a stage 42. Disposed on the front (the right side of the drawing) of the stage 42 is a ventilation chamber 44 connected thereto through a fan 43. The ventilation chamber 44 is for example vertically formed in the rack unit U3. The ventilation chamber 44 is connected to a temperature adjustment air supplying portion (not shown). Opening portions 40 (40a and 40b) are formed at portions that surround the stage 42 in the left and right side walls 45 of the housing 41. A wafer W is loaded and unloaded to and from the opening portions 40 (40a and 40b). Coolant flow paths 46 and ventilation openings 147 are formed on the rear surfaces of the side walls 45. The opening portions 40 (40a and 40b) can be freely opened and closed by shutters 47. The main transferring mechanism 25B and the main transferring portion 31A are capable of accessing the interior of the housing 41 through the opening portion 40a and the opening portion 40b, respectively. In addition, the ventilation openings 147 are connected to the housing 41 through fans 48.

Figure 5:
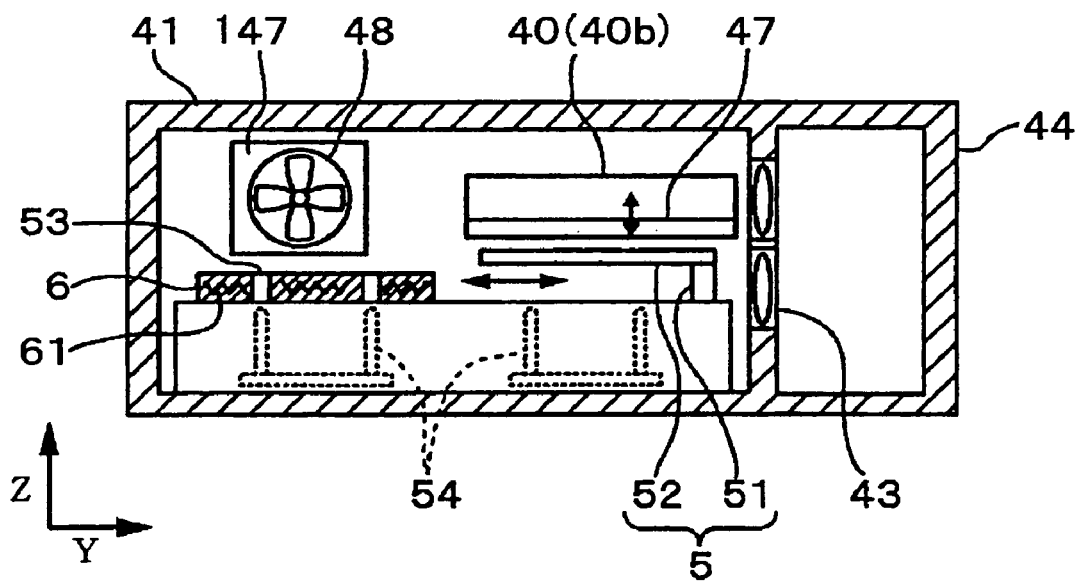
FIG. 5 is a vertical sectional view showing the heating unit (PEB).

Disposed in the front and rear of an upper surface of the stage 42 are a cooling arm 5 and a heating plate 6 that has a hater 61, respectively. The cooling arm 5 transfers a wafer W between the main transferring mechanism 25B or the main transferring portion 31A (described later) that enter the housing 41 through the opening portions 40 (40a and 40b) and the heating plate 6. In addition, the cooling arm 5 slightly cools a wafer W that has been heated while it is being transferred. Thus, as shown in FIG. 5, a leg portion 51 is capable of advancing and retreating in the Y direction along a guide means 49 (see FIG. 4) disposed on the stage 42. Thus, a cooling plate 52 is capable of moving from side positions of the opening portions 40 (40a and 40b) to an upper position of the heating plate 6. Disposed on the rear surface of the cooling plate 52 is a cooling flow path that causes for example temperature controlling water to flow.

At each of transferring positions between the main transferring mechanism 25B or the main transferring portion 31A and the cooling plate 52 on the stage 42 and between the heating plate 6 and the cooling plate 52, three support pins 54 that protrude and sink through hole portions 53 are disposed. The cooling plate 52 has slits 55 through which the support pins 54 rise and hold the wafer W.

Returning to FIG. 1, the far side of the rack unit U3 of the processing block B2 is connected to an aligner B4 through an interface portion B3. Next, with reference to FIG. 1, FIG. 2, and FIG. 6, the interface portion B3 will be described. The interface portion B3 is composed of a first transferring chamber 3A and a second transferring chamber 3B disposed in the front and rear between the processing block B2 and the aligner B4. The first transferring chamber 3A and the second transferring chamber 3B have a main transferring portion 31A and a sub transferring portion 31B, respectively. The main transferring portion 31A and the sub transferring portion 31B compose a second transferring means 31. The main transferring portion 31A is composed of a base 32 and an arm 33. The base 33 is capable of rising, lowering, and rotating around the vertical axis. The arm 33 is disposed on the base 32 and capable of advancing and retreating. Disposed in the first transferring chamber is a peripheral aligner (WEE) and two buffer cassettes (SUB) on the left viewed from the carrier mounting portion B1. The periphery aligner (WEE) selectively exposes only an edge portion of a wafer W. Each of the buffer cassettes (SBU) temporarily buffers a plurality of wafers W (for example, 25 wafers W). Disposed in the first transferring chamber are also a transferring unit (TRS3) and two accurate temperature controlling units (CPL2) on the right viewed from the carrier mounting portion B1. Each of the temperature controlling units (CPL2) has a cooling plate.

Next, with reference to FIG. 7, the operations of the transfer arm 23 and the main transferring mechanisms 25 (25A and 25B), which compose the first transferring means, and second transferring means 31 (31A and 31B) will be described. The transfer arm 23 transfers a unprocessed wafer W from a carrier C placed on the carrier mounting portion B1 to the transferring unit (TRS1) and a processed wafer W from the cooling unit (CPL4) to the carrier C. The main transferring mechanisms 25 (25A and 25B) transfer a wafer W from the transferring unit (TRS1) to the hydrophobic processing unit (ADH), the cooling unit (CPL1), the coating unit (COT), the heating unit (PAB), and the transferring unit (TRS2) in their order and a wafer W that has been unloaded from the interface portion B3 and placed on the heating unit (PEB) to the cooling unit (CPL3), the developing unit (DEV), the heating unit (POST), and the cooling unit (CPL4) in their order.

The main transferring portion 31A transfers an unexposed wafer W placed on the transferring unit (TRS2) to the periphery aligner (WEE), the buffer cassette (SBU), and the accurate temperature controlling unit (CPL2) in their order and an exposed wafer W that has been transferred to the transferring unit (TRS3) by the sub transferring portion 31B to the heating unit (PEB).

In the sub transferring portion 31B, a base 34 is capable of moving leftward and rightward with an operation of a guide mechanism 35 that is capable of rising and lowering and rotating around the vertical axis. Disposed on the base 34 is an arm 36 that is capable of advancing and retreating. The sub transferring portion 31B transfers a wafer W from the accurate temperature controlling unit (CPL2) to a loading stage 37 of the aligner B4 and a wafer W on an unloading stage 38 of the aligner B4 to the transferring unit (TRS3). The second transferring means 31 (31A and 31B) are driven and controlled corresponding to commands received from a controlling portion that will be described later.

Figure 8:
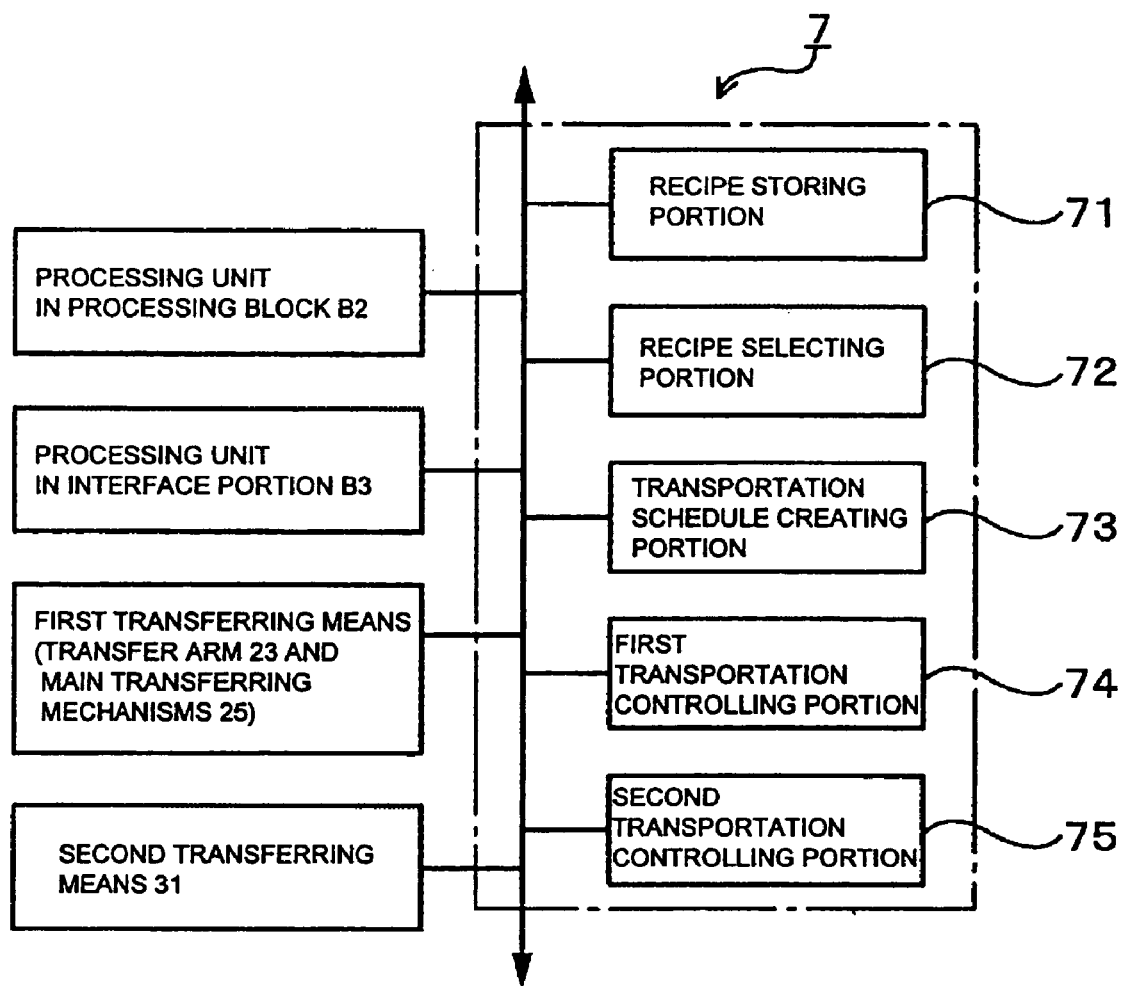
FIG. 8 is a schematic diagram showing an example of a structure of a controlling unit of the coating and developing apparatus.

The pattern forming apparatus has a controlling portion 7. The controlling portion 7 drives and controls the main transferring mechanisms 25 (25A and 25B) and the second transferring means 31 (31A and 31B). In addition, the controlling portion 7 controls each processing unit. FIG. 8 shows a structure of the controlling portion 7. In reality, the controlling portion 7 is composed of a central processing unit (CPU), a program, a memory, and so forth. In this example, however, parts of structural elements are treated as blocks.

In FIG. 8, reference 70 represents a bus. Connected to the bus 70 are a recipe storing portion 71, a recipe selecting portion 72, a transportation schedule creating portion 73, a first transportation controlling portion 74, and a second transportation controlling portion 75. The recipe storing portion 71 is a portion that stores for example a transportation recipe that describes a transportation path for wafers W and a plurality of recipes that describe processing conditions of wafers W. The recipe selecting portion 72 is a portion that selects a proper one from recipes stored in the recipe storing portion 71 and inputs for example the number of wafers to be processed and the type of a resist.

The transportation schedule creating portion 73 is a portion that creates a transportation schedule that describes what timings all wafers W of the lot will be transferred to what units corresponding to a transportation recipe for wafers W. According to this embodiment, the transportation schedule creating portion 73 creates a transportation schedule for the carrier mounting portion B1 and the processing portion B2. In reality, for the outgoing path, the transportation schedule creating portion 73 creates a transportation schedule for a region from a carrier C placed on the carrier mounting portion B1 to the transferring unit (TRS2) before the interface portion B3. For the incoming path, the transportation schedule creating portion 73 creates a transportation schedule for a region from the heating unit (PEB) to the carrier C placed on the carrier mounting portion B1. The transportation schedule creating portion 73 creates these transportation schedules at their respective timings that will be described later. The first transportation controlling portion 74 controls the first transferring means (the transfer arm 23 and the main transferring mechanisms 25) corresponding to a transportation schedule created by the transportation schedule creating portion 73.

According to this embodiment, it is important to consider how to unload an exposed wafer W from a heating unit (PEB) corresponding to what transportation schedule. When a portion at which a wafer W is placed is called a module, the first transferring means composed of the transfer arm 23 and the main transferring mechanisms 25 (25A and 25B) takes out one wafer W from a loaded carrier C and transfers the wafer W to the next downstream module. The first transferring means successively transfers wafers W from modules to the immediately downstream modules. After the first transferring means has transferred a wafer W from the second most downstream module to the most downstream module, one phase (cycle) is completed.

The first module is a module at which the last wafer W of a module group is present in a transportation path. When there is an unprocessed wafer W in a carrier C, the first module is this carrier C. The last module is a module that the first wafer is present in a transportation path. When all the processes have been performed for the first wafer and it has been returned to the original carrier C, the last module is this carrier C. If the first wafer W has been developed and not returned to the carrier C and the wafer W is present in the heating unit (POST), this heating unit (POST) is the last module.

When an exposed wafer W has been loaded into the heating unit (PEB), the wafer W is unloaded from the heating unit (PEB) after the number of cycles including the cycle of the first transferring means becomes smaller than the number of heating units (PEB) by one. In other words, the transportation schedule creating portion 73 describes a wafer W to a portion corresponding to the cooling unit (CPL3) as the next module of the heating unit (PEB) in a phase four cycles later than the five heating units (PEB) by one.

The second transportation controlling portion 75 controls the second transferring means 31 (31A and 31B). When a source module outputs a signal that represents that this module can unload a wafer W and a destination module outputs a signal that represents that this module can load a wafer W, the second transportation controlling portion 75 controls the second transferring means 31 (31A and 31B) to successively transfer wafers W unloaded from the source module to the destination module. In this example, the modules are the transferring unit (TRS2), the periphery aligner (WEE), the buffer cassette (SBU), the cooling unit (CPL2), the loading stage 37, the unloading stage 38, the transferring unit (TRS3), and the heating units (PEB)

The aligner according to this embodiment corresponds to a processing apparatus according to the present invention. The heating units (PEB) according to this embodiment correspond to transfer processing units corresponding to the present invention. The transfer processing units perform a predetermined process for a substrate processed by the processing apparatus. The number "five" of the tiered heating units (PEB) correspond to "n" (any integer that is 2 or larger) according to the present invention.

Next, the operation of this embodiment of the present invention will be described. Before a process for a wafer W as a substrate is started, the operator selects a recipe. When the operator selects a recipe, the transportation schedule creating portion 73 creates a first half transportation schedule for example shown in FIG. 9 for all wafers of the lot. In this example, the transportation schedule creating portion 73 creates a transportation schedule for a region from a carrier C placed on the carrier mounting portion B1 to the transferring unit (TRS2) for wafers W1 to W3 of the lot.

In FIG. 9, it is assumed that 10 wafers A01 to A10 are successively transferred and that the number of units of each type is one. In FIG. 9, due to the limited space of the drawing, part of modules are omitted. For example, the heating unit (PEB) is followed by the developing unit (DEV), not the cooling unit (CPL3) that is omitted. In reality, many wafers W are processed and a plurality of processing units is disposed with respect for example the ADH, the CPL, the COT, and the PAB. A plurality of processing units of the same types is identified by No. 1, No. 2, and so forth. As shown in FIG. 10, with a plurality of ADH fields ADH-1, ADH-2, . . . , and so forth corresponding to the number of processing units and a plurality of phases corresponding to the number of processing units, a schedule is created. However, this notation will result in a complicated description and a wide drawing space. Thus, a transportation schedule is simplified as shown in FIG. 9.

The controlling portion 7 outputs commands to individual portions with reference to the transportation schedule. The individual portions start processing wafers W corresponding to the commands. Each wafer W of the lot is taken out from a carrier C by the transfer arm 23 of the carrier mounting portion B1 and transferred to the transferring unit (TRS1). Thereafter, as shown in FIG. 7, each wafer W is transferred to the transferring unit (TRS1), the hydrophobic processing unit (ADH), the coating unit (COT), the heating unit (PAB), and the transferring unit (TRS2) that perform predetermined processes for each wafer W. As described above, the main transferring mechanisms 25 (25A and 25B) each have three arms. The main transferring mechanisms 25 (25A and 25B) take out a wafer W from the hydrophobic processing unit (ADH) and loads a wafer received from the transferring unit (TRS1) to the hydrophobic processing unit (ADH). In such a manner, the main transferring mechanisms 25 (25A and 25B) successively receive wafers W from processing units and transfers them to the next processing units.

Figure 7:
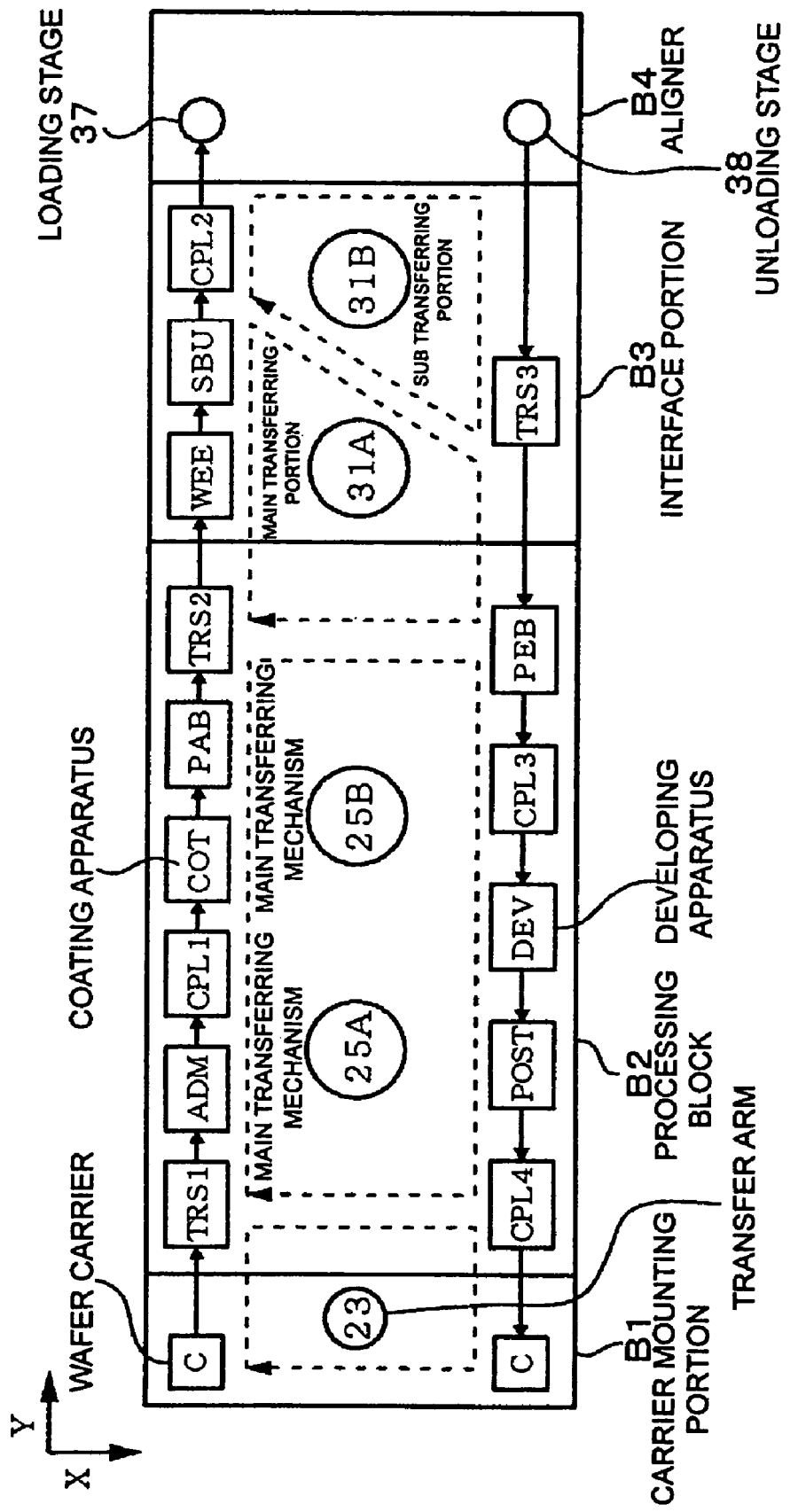
FIG. 7 is a plan view showing a transportation path of a wafer in the coating and developing apparatus.

When a wafer W is transferred to the transferring unit (TRS2), as shown in FIG. 7, the wafer W is transferred to the periphery aligner (WEE), the buffer cassette (SBU), the cooling unit (CPL2), and the loading stage 37 in their order in the interface portion B3. Thereafter, the wafer W is exposed in the aligner B4. After an exposing process has been performed for the wafer W, it is transferred from the unloading stage 38 to the heating unit (PEB) of the processing block B2 through the transferring unit (TRS3). However, since the operations of the second transferring means 31 (31A and 31B) are not contained in the first half transportation schedule, the second transferring means 31 asynchronously (independently) operates against the transfer arm 23 and the main transferring mechanisms 25 (25A and 25B). After an out-ready signal for the unloading stage 38 is output, the transportation schedule creating portion 73 creates a second half transportation schedule, namely, an incoming path transportation schedule for which each wafer W has been transferred to the heating unit (PEB) of the processing block B2.

FIG. 9 is a schematic diagram showing the relationship between the wafers A01 to wafer A10 that are transferred to the interface portion B3 (denoted by "IFB" in the drawing), exposed by the aligner B4, and loaded into the heating unit (PEB) and phases of the transportation schedule. For example, A01+2 represents that the wafer A0 and the next two wafers (A02 and A03) are present in the interface portion B3 and the aligner B4. As shown in FIG. 9, a transportation schedule is created so that when the first wafer A01 has been exposed and loaded into the heating unit (PEB) by the second transferring means 31 of the interface portion B3, the main transferring mechanism 25B as the first transferring means transfers the wafer A01 in phase 10 and unloads it in phase 13, which is four cycles later than phase 10. In reality, although the next unit to which the wafer W is transferred from the heating unit (PEB) is the cooling unit (CPL3), the wafer A01 is described in the field of the developing unit (DEV) as the destination unit.

In the heating unit (PEB), a wafer W is transferred to the cooling plate 52 through one opening portion 40a (see FIG. 4) by the second transferring means. The wafer W is transferred from the cooling plate 52 to the heating plate 6. The heating plate 6 heats the wafer W. Thereafter, the wafer W is transferred to the cooling plate 52. The cooling plate 52 slightly cools the wafer W. Thereafter, the main transferring mechanism 25B unloads the wafer W from the heating unit (PEB) through the other opening portion 40b.

In one cycle of the transportation schedule, one wafer is unloaded from the aligner B4. However, occasionally, in one cycle, two wafers may be unloaded from the aligner B4. In the same cycle, two wafers may be transferred from the aligner B4 to the heating unit (PEB). For example, assuming that in phase 15 shown in FIG. 9, the wafers A06 and A07 are unloaded from the aligner B4, there are two idle heating units (PEB). This is because when a wafer is left in the heating unit (PEB), the cycle of the first transferring means is "4" and the number of tiered heating units (PEB) is "5." Thus, the wafers A06 and A07 are loaded into the heating units (PEB). The wafers A06 and A07 are unloaded in phases 18 and 19, respectively, by the main transferring mechanism 25B.

Thus, the number of wafer stay cycles temporarily increases by 1 from the number of regular wafer stay cycles. As a result, the number of cycles becomes 5. When two wafers are transferred in one cycle of the transportation schedule, there is a cycle in which no wafer is unloaded from the aligner B4 (for example, in phase 17 of FIG. 9). In the cycle, an idle heating unit (PEB) is added. When two wafers are transferred in one cycle of the transportation schedule, there may be a cycle in which no wafer is unloaded from the aligner B4.

Thus, according to this embodiment of the present invention, as transferring units that transfer exposed wafers W from the second transferring means 31 to the main transferring mechanisms 25 (25A and 25B), a plurality of heating units (PEB) (for example, five-tiered units) are disposed. With the cooling plates 52 of the heating units (PEB), wafers W are transferred between the main transferring mechanisms 25 as the first transferring means and the second transferring means 31 of the interface portion B3. The first transferring means is controlled so that a wafer W loaded into the heating units (PEB) by the second transferring means 31 is unloaded in the fourth cycle including the cycle of the first transferring means, namely after cycles (n−1), which is smaller by one than the number of tiered heating units (PEB), which is denoted by n, have elapsed.

Thus, times after wafers are exposed until they are heated by the heating units (PEB) do not largely vary. In addition, exposed wafers are prevented from being left in the interface portion B3. Thus, the throughput of the aligner B4 can be prevented from lowering. Consequently, the performance of the aligner B4 can be fulfilled. The reason will be described with reference to FIG. 11 and FIG. 12. FIG. 11 shows a transportation schedule that describes that the first transferring means is controlled to unload a wafer from the heating units (PEB) in the fifth cycle of the first transferring means in the transportation schedule, namely after the number of cycles that is the same as the number of tiered heating units (PEB) has elapsed. In FIG. 11, when the wafers A05 and A06 are loaded into the heating units (PEB) in phase 9 (cycle 9), since there is only one idle heating unit (PEB), although the wafer A05 can be loaded into the heating unit (PEB), the wafer A06 has to be left in the interface portion B3. As a result, the transportation time after the wafer A06 is transferred from the aligner B4 to the heating unit (PEB) becomes longer than other wafers. In other words, the post-exposure pre-heat time of the wafer A06 becomes longer than the other wafers. When the wafer A06 is left in the interface portion B3, no wafer can be unloaded from the aligner B4. As a result, the operation of the aligner B4 has to be stopped.

Figure 12:
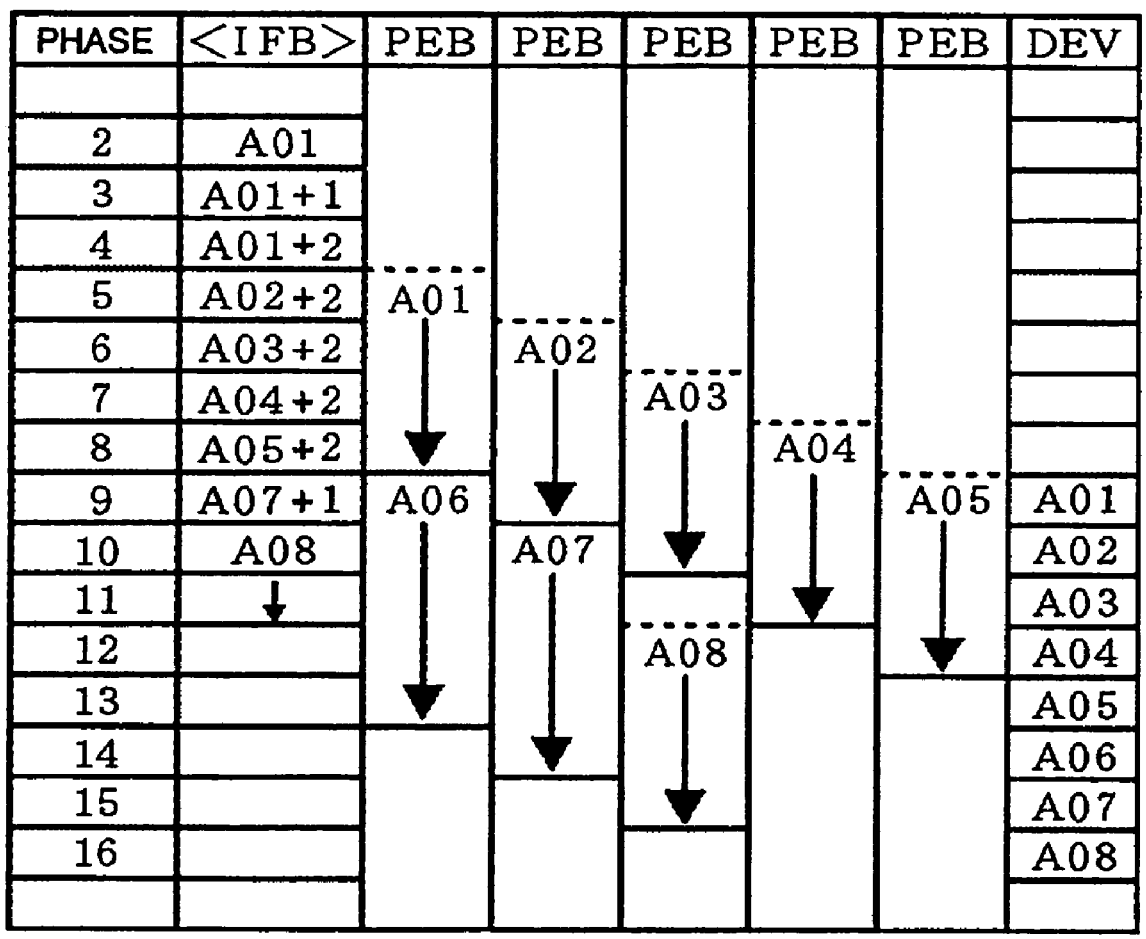
FIG. 12 is a schematic diagram describing an example of a transportation schedule according to an embodiment in comparison with the transportation schedule for the comparison.

FIG. 12 shows a transportation schedule that describes that the first transferring means is controlled to unload a wafer from the heating units (PEB) after the number of cycles "4" that is smaller by one than the number of tiered heating units (PEB) has elapsed. In this case, since two heating units (PEB) are idle, both the wafers A05 and A06 can be loaded into the heating units (PEB). Thus, post-exposure pre-heat elapse times do not largely vary. Consequently, for example chemically amplifying type resist can be prevented from being adversely affected by the developing process. As a result, line widths of circuit patterns can be prevented from varying. Thus, the yield of the products can be improved.

According to the present invention, it is preferred that the maximum time of the post-exposure pre-heat elapse times is pre-designated so that they are kept uniform for all wafers of the lot. This method is effective when wafers W are transferred as shown in FIG. 12. However, when a wafer is unloaded after the number of cycles that is same as the number of tiered heating units (PEB) has elapsed, the maximum time has to be designated corresponding to the case that for example the wafer A06 is left in the interface portion B3. Thus, since the transportation times for all the wafers from the aligner B4 to the heating units (PEB) become long, this method cannot be used.

Figure 13:
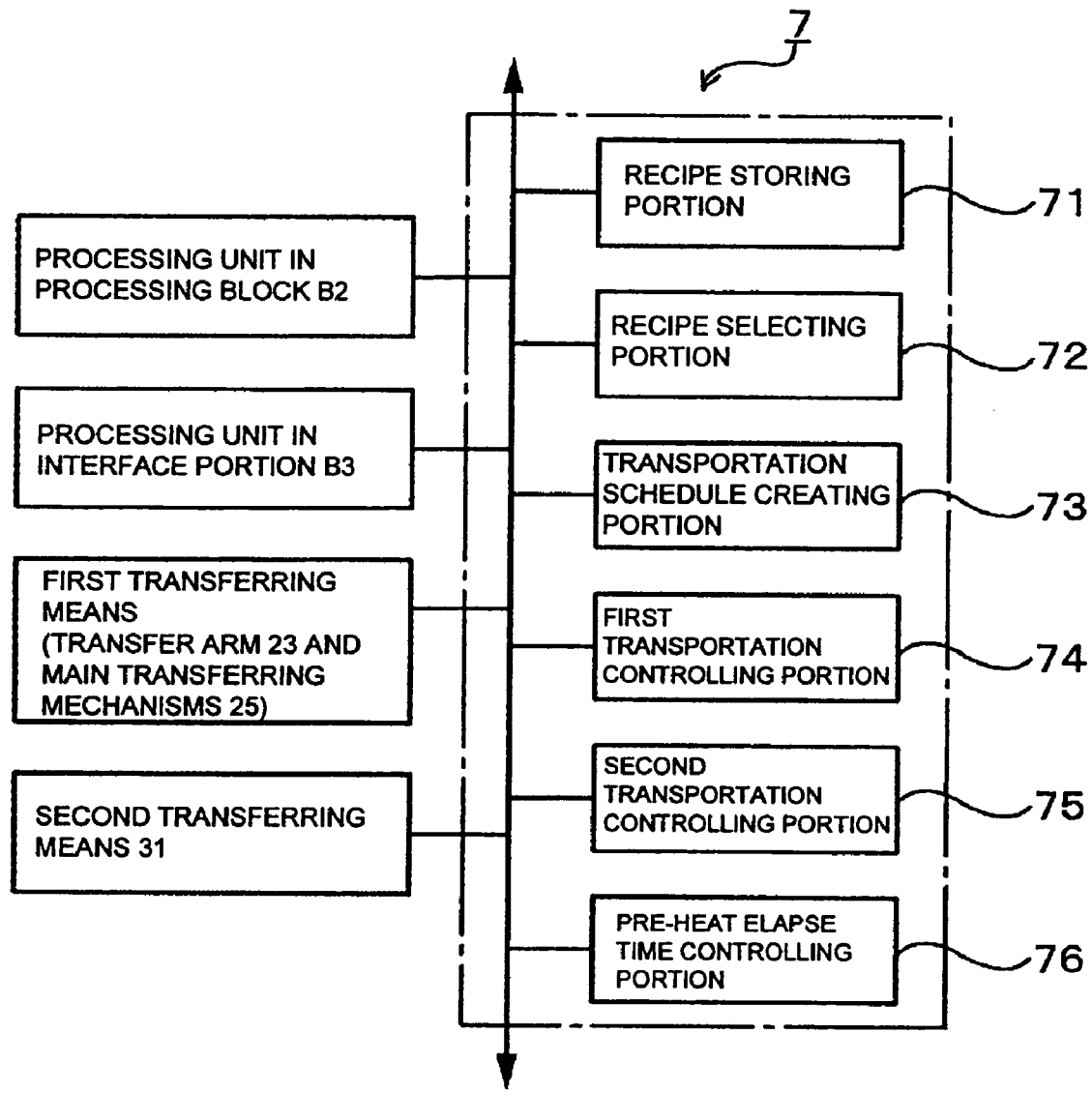
FIG. 13 is a schematic diagram showing a structure of another example of the controlling unit.
Figure 14:
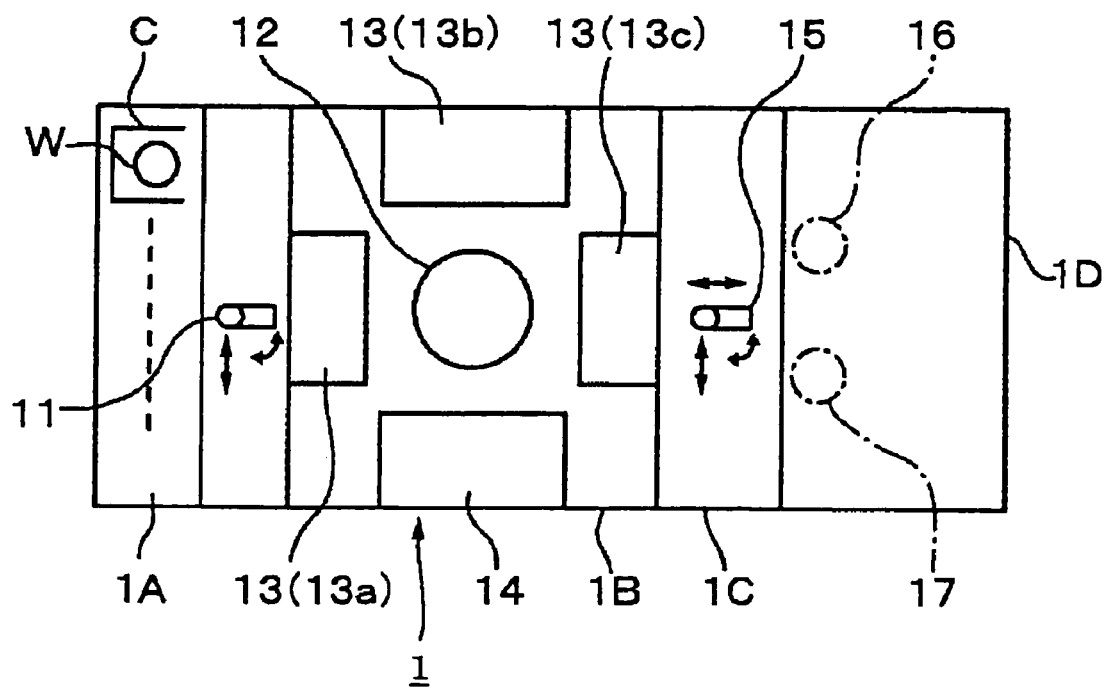
FIG. 14 is a plan view showing a coating and developing apparatus of a related art reference.
Figure 15:
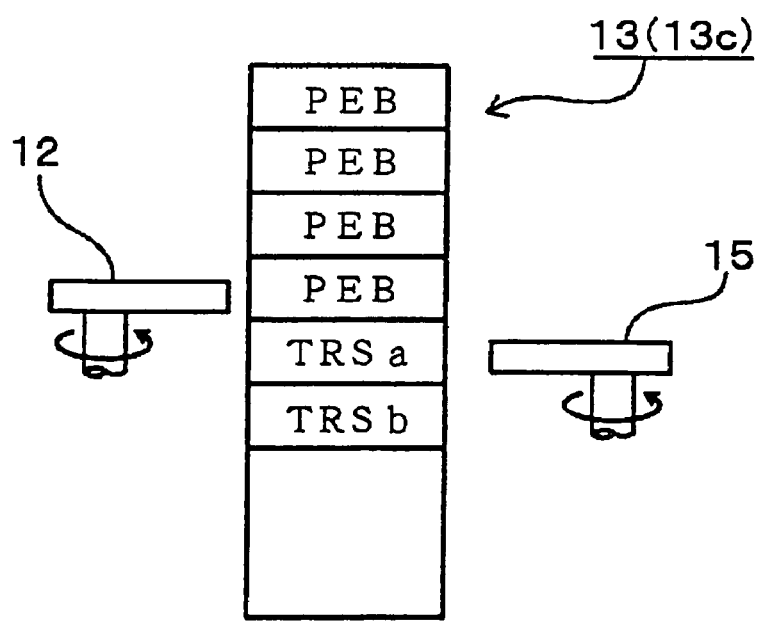
FIG. 15 is a schematic diagram describing a part of the coating and developing apparatus of the related art reference.
Figure 16:
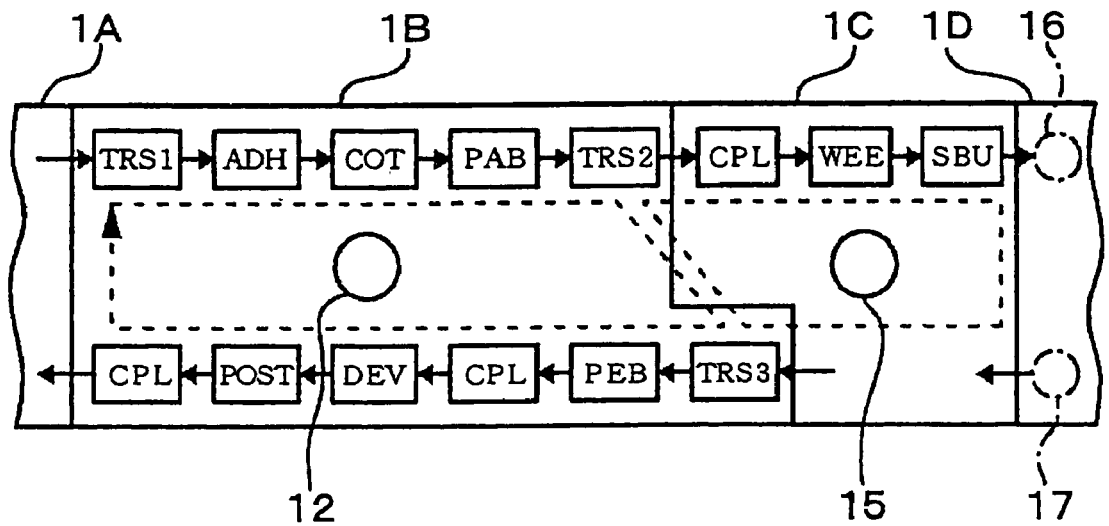
FIG. 16 is a plan view showing a transportation path of a wafer in the coating and developing apparatus of the related art reference.

FIG. 13 shows a structure of the controlling portion 7 that includes a pre-heat elapse time adjusting portion 76. The pre-heat elapse time adjusting portion 76 has a program that adjusts a pre-heat elapse time t after the aligner B4 exposes a wafer W and outputs an out-ready signal until the heating unit (PEB) starts heating the wafer W to a predetermined time. The program causes the time t of any wafer to keep uniform. In reality, the program causes the time t of a wafer W to be obtained when it is placed on the cooling plate 52 of the heating unit (PEB), the difference between the pre-determined time and the time t to be obtained, and the wafer W to be left in the heating unit (PEB) for the time corresponding to the difference so that the wafer W is held on the heating plate 6 with the support pins 54. The wafer W may be held on the cooling plate 52 or with the support pins 54. The predetermined time is the maximum time that is expected in various cases after the out-ready signal is output from the aligner B4 until a wafer W is heated by the heating unit (PEB).

The second transferring means 31 of the interface portion 1C may not be divided into the main transferring portion 31A and the sub transferring portion 31B, but one transferring portion. In addition, the number of tiered heating units (PEB), which is denoted by n, may not be limited to "5." Alternatively, the number of heating units (PEB) may be "2," "3," "4," or "6" or larger. After a wafer W is loaded into a heating unit (PEB), the wafer W may be unloaded after (n−2) cycles or (n−3) cycles, each of which includes the transferring cycle of the first transferring means rather than (n−1) cycles including the transferring cycle have elapsed. In other words, according to the present invention, when m represents an integer that is 1 or larger and smaller than n, a wafer W is unloaded from a heating unit (PEB) after (n−m) cycles have elapsed.

The present invention is not limited to the coating and developing apparatus. Alternatively, the present invention may be applied to for example a system of which a processing unit coats an insulation film on a substrate, a transfer processing unit performs a gelling process for the substrate, a first transferring means takes out the substrate from the transfer processing unit and transfers the substrate to a bake processing unit, a cure processing unit, and a substrate unloading portion.

Next, with reference to FIG. 7 and FIG. 8, another embodiment of the present invention will be described.

As shown in FIG. 8, the first transportation controlling portion 74 controls the transfer arm 23 and the main transferring mechanisms 25 (25A and 25B) as the first transferring mechanism corresponding to a transportation schedule created by the transportation schedule creating portion 73. On the other hand, the second transportation controlling portion 75 controls the main transferring portion 31A and the sub transferring portion 31B as the second transferring mechanism. At this point, the transfer arm 23, the main transferring mechanisms 25 (25A and 25B), the main transferring portion 31A, and the sub transferring portion 31B are controlled so that they independently (asynchronously) transfer wafers W. The second transportation controlling portion 75 controls the main transferring portion 31A, the sub transferring portion 31B, and the aligner B4 so that they synchronously operate.

According to this embodiment, when lots are switched, if it takes times to replace reticles and change parameters for the exposing process or an alarm takes place, the aligner B4 may not unload a wafer W for a while. Thus, for example, after reticles are switched, the aligner B4 may successively unload wafers W.

At this point, as shown in FIG. 7, the main transferring portion 31A and the sub transferring portion 31B are controlled independent from the transfer arm 23 and the main transferring mechanisms 25A and 25B. Thus, the main transferring portion 31A and the sub transferring portion 31B can successively transfer exposed wafers W to n number of heating unit (PEB) as third processing units. Thus, even if the transfer arm 23 and the main transferring mechanisms 25A and 25B cannot unload wafers heated in the heating units (PEB) in time, they can load exposed wafers W to the heating units (PEB). Thus, the aligner B4 that unloads wafers W to the heating units (PEB) can be prevented from stopping. In addition, since n number of heating units (PEB) are disposed, even if the main transferring mechanisms 25A and 25B largely delay transferring wafers W, exposed wafers can be successively transferred to the heating units (PEB).

According to this embodiment, the main transferring portion 31A and the sub transferring portion 31B shown in FIG. 7 are independently controlled by the second transportation controlling portion 75. Thus, the main transferring portion 31A and the sub transferring portion 31B can share transportation of wafers W. For example, while the main transferring portion 31A is transferring a wafer W from the periphery aligner (WEE) to the buffer cassette (SBU), a wafer W exposed by the aligner B4 may be able to be transferred. At this point, while the main transferring portion 31A is transferring a wafer W, the sub transferring portion 31B is capable of quickly transferring a wafer W from the aligner B4 to the transferring unit (TRS3).

Next, with reference to a flow chart shown in FIG. 17, a control that causes the pre-heat elapse time, namely post-exposure delay time $T_{PED}$ after the aligner B4 exposes a wafer W until the heating unit (PEB) heats the wafer to kept uniform for each wafer W will be described.

Figure 17:
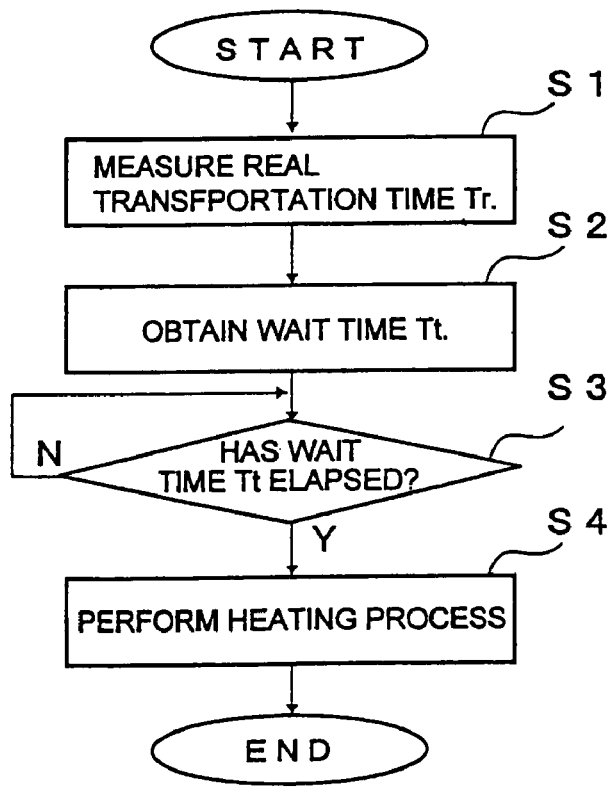
FIG. 17 is a flow chart showing a control that causes the maximum value Tmax of transportation start delay times of another embodiment to be uniform.

As shown in FIG. 17, at step S1, the controlling portion 7 measures the real transportation time Tr after the aligner B4 exposes a wafer W until the heating unit (PEB) starts heating the wafer W.

Thereafter, at step S2, with the real transportation time Tr measured at step S1, the wait time Tt for which the wafer W is left on for example the cooling plate 52 is obtained.

Wait time Tt=(maximum value Tmax of transportation start delay times)+(minimum time Tmin)− (real transportation time Tr)

Figure 18:
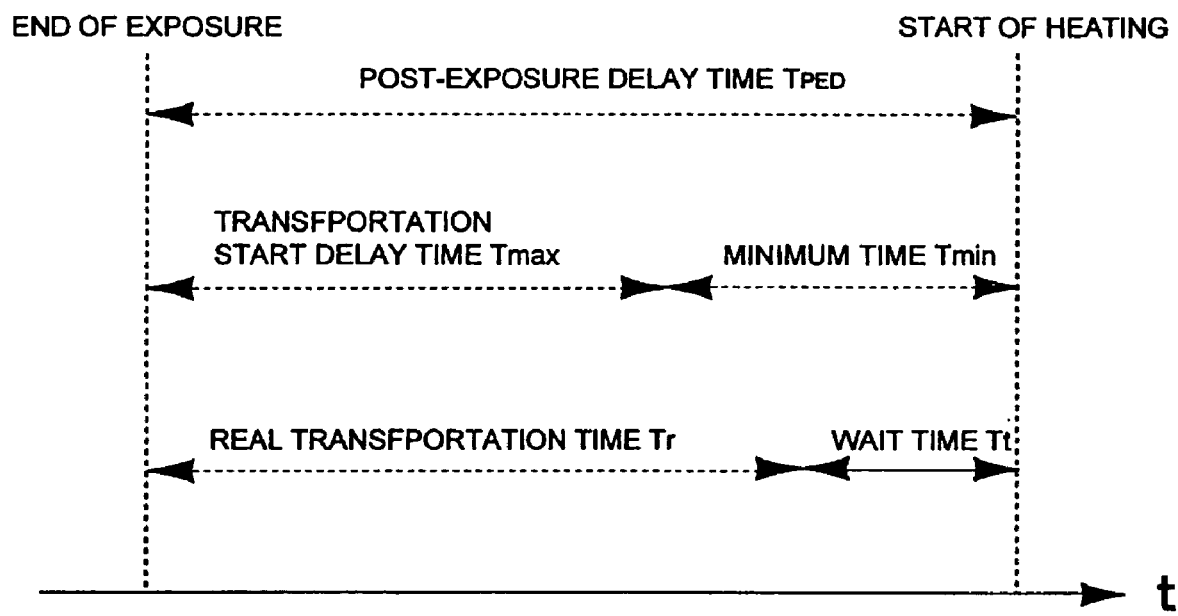
FIG. 18 is a schematic diagram showing the relationship of a wait time, the maximum value and the minimum value of transportation start delay times, and real transportation time.

FIG. 18 shows the relationship of wait time Tt, maximum value Tmax of transportation start delay times, minimum time Tmin, and real transportation time Tr. The maximum value Tmax of the transportation start delay times represents the maximum value Tmax for which a wafer W is left in the aligner B4, namely the maximum value Tmax after the aligner B4 completes exposure for a wafer W until the second transferring means 31 receives it. The minimum time Tmin represents the minimum time after the main transferring portion 31A receives an exposed wafer W until the main transferring portion 31A transfers it to the heating unit (PEB). The maximum value Tmax of the transportation start delay times is provided in a transportation speed–transportation start delay time maximum value Tmax table obtained through transportation tests with different transportation speeds. The transportation speed–transportation start delay time maximum value Tmax table is pre-stored in the controlling portion 7. The minimum time Tmin is provided in a transportation speed–minimum time Tmin table obtained through tests with different transportation speeds. Likewise, the transportation speed–minimum time Tmin table is pre-stored in the controlling portion 7. Thus, by measuring only the real transportation time Tr, the wait time Tt can be obtained.

Thereafter, at step S3, a wafer W is left in the heating unit (PEB) for the wait time Tt obtained at step S2.

Next, at step S4, the heating unit (PEB) starts the heating process for the wafer W. Thus, the post-exposure delay time TPED can be kept uniform for each wafer W. In other words, since a heating process is performed for each exposed wafer W at the same timing, the line widths of patterns of individual wafers W can be prevented from varying.

According to this embodiment, the first transportation controlling portion 74 controls the transfer arm 23 and the main transferring mechanisms 25 to unload wafers from the heating units (PEB) before the sum of the number of wafers loaded into the heating units (PEB), the number of wafers transferred among the processing block B2, the interface portion B3, the aligner B4, and the heating units (PEB), and the number of wafers processed in the processing block B2, the interface portion B3, and the aligner B4 becomes equal to the number of heating units (PEB). For example, the case that wafers have been loaded into two of five heating units (PEB) shown in FIG. 3 will be described. At this point, before the number of wafers that have been processed in the processing block B2, the interface portion B3, and the aligner B4 or transferred thereto becomes three, the main transferring mechanisms 25 unload wafers from the heating units (PEB). Thus, the heating units (PEB) are always kept idle and are capable of loading wafers W. Consequently, exposed wafers W can be prevented from being left stagnant in the aligner B4. As a result, the manufacturing capacity of the aligner B4 can be maximally used.

Figure 6:
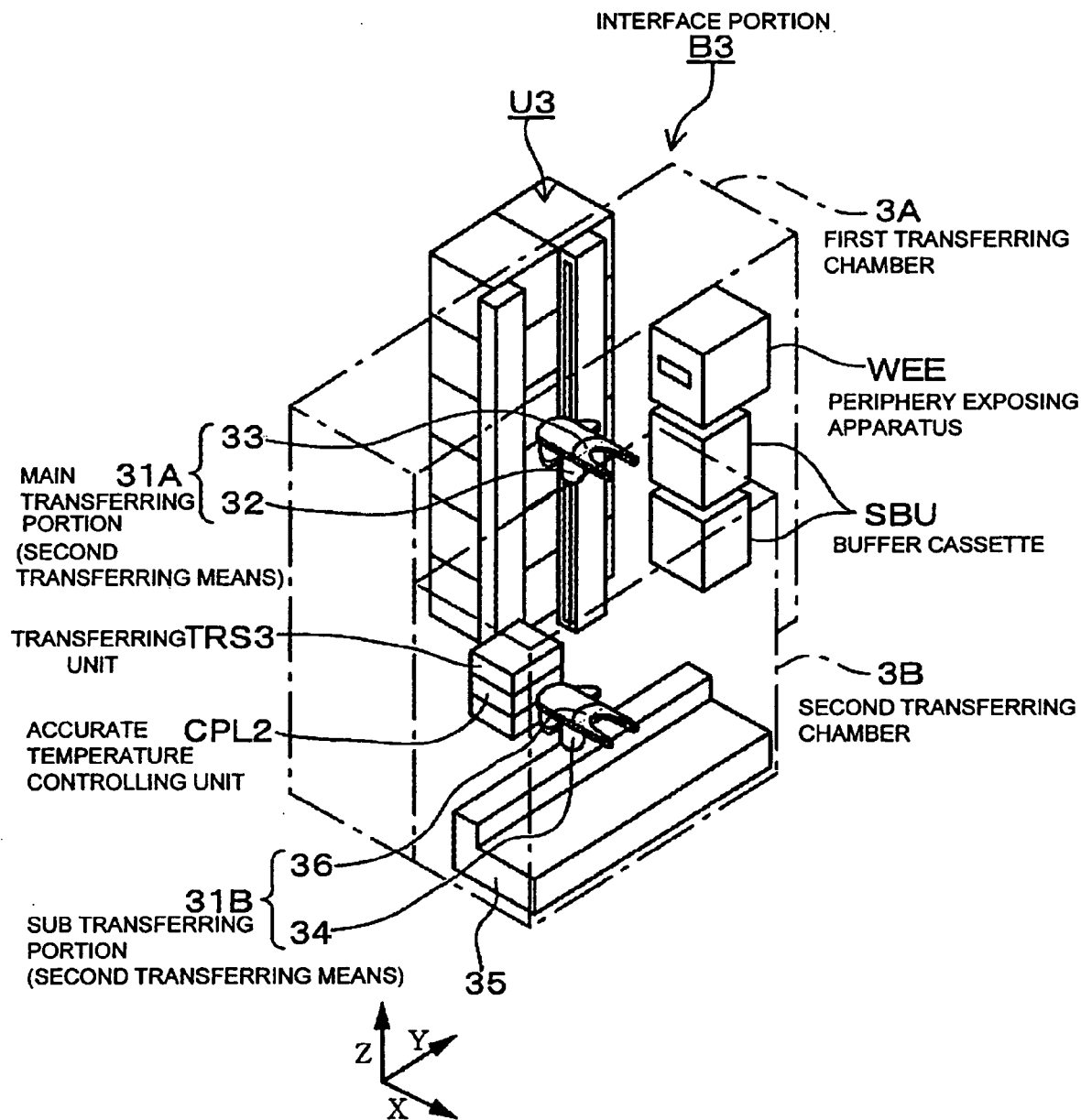
FIG. 6 is a schematically perspective view showing an interface portion of the coating and developing apparatus.
Figure 19:
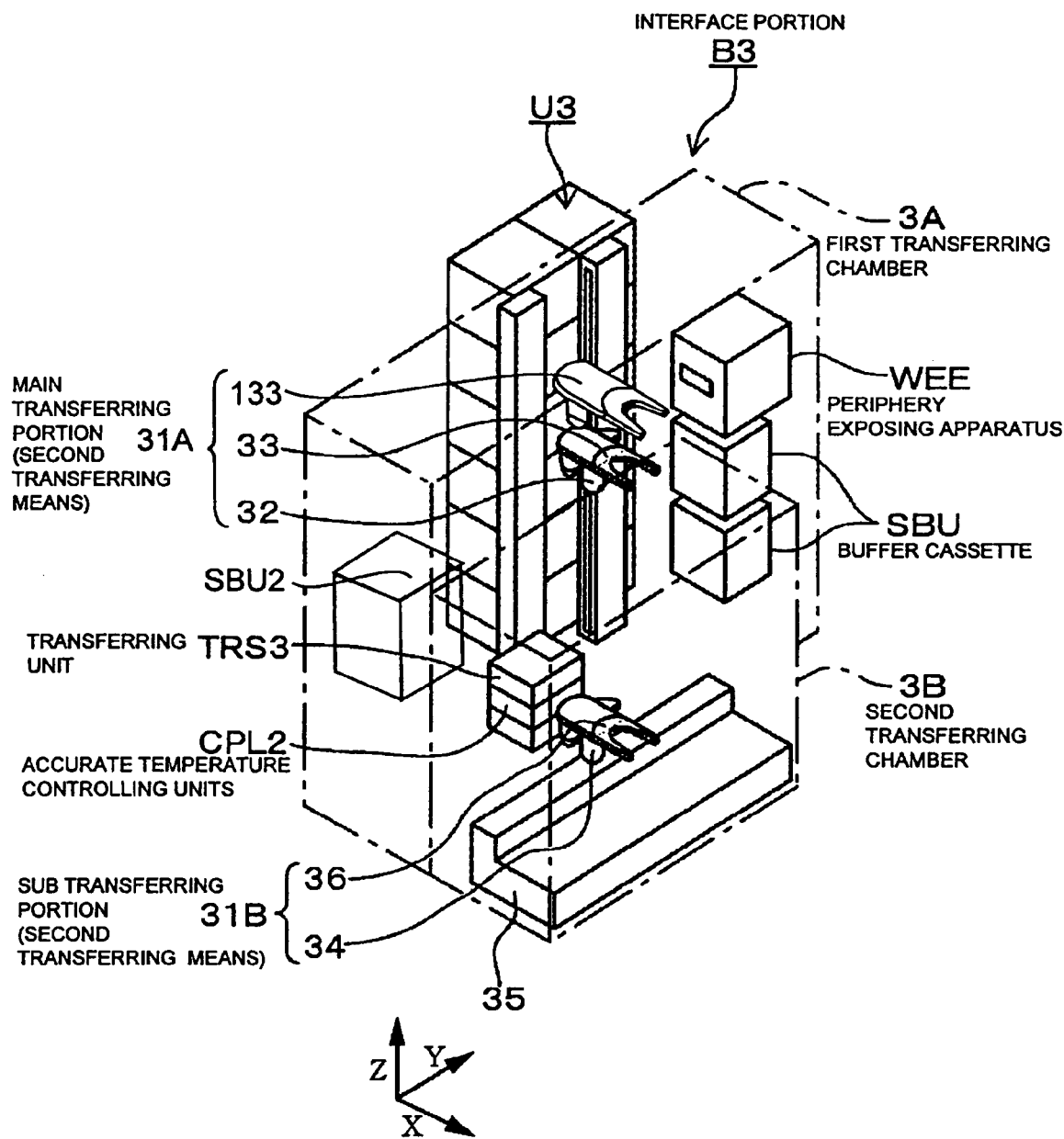
FIG. 19 is a schematically perspective view showing an interface portion of the coating and developing apparatus according to the other embodiment.

As shown in FIG. 6, the main transferring portion 31A has for example one arm 33. Alternatively, as shown in FIG. 19, the main transferring portion 31A may have an arm 133 that is a second transferring member disposed above the arm 33 as the first transferring member. Thus, while an exposed wafer W is placed on the arm 133, another wafer W that has not been exposed can be transferred for example from the periphery aligner (WEE) to the buffer cassette (SBU). Thus, the wafers W can be smoothly transferred. In addition, wafers W can be placed on the arm 33 and the arm 133 so that the arm 133 holds (buffers) an unexposed wafer W. When at least one of the main transferring portion 31A and the sub transferring portion 31B has the arm 133, the same effect as the foregoing embodiment can be achieved.

Figure 20:
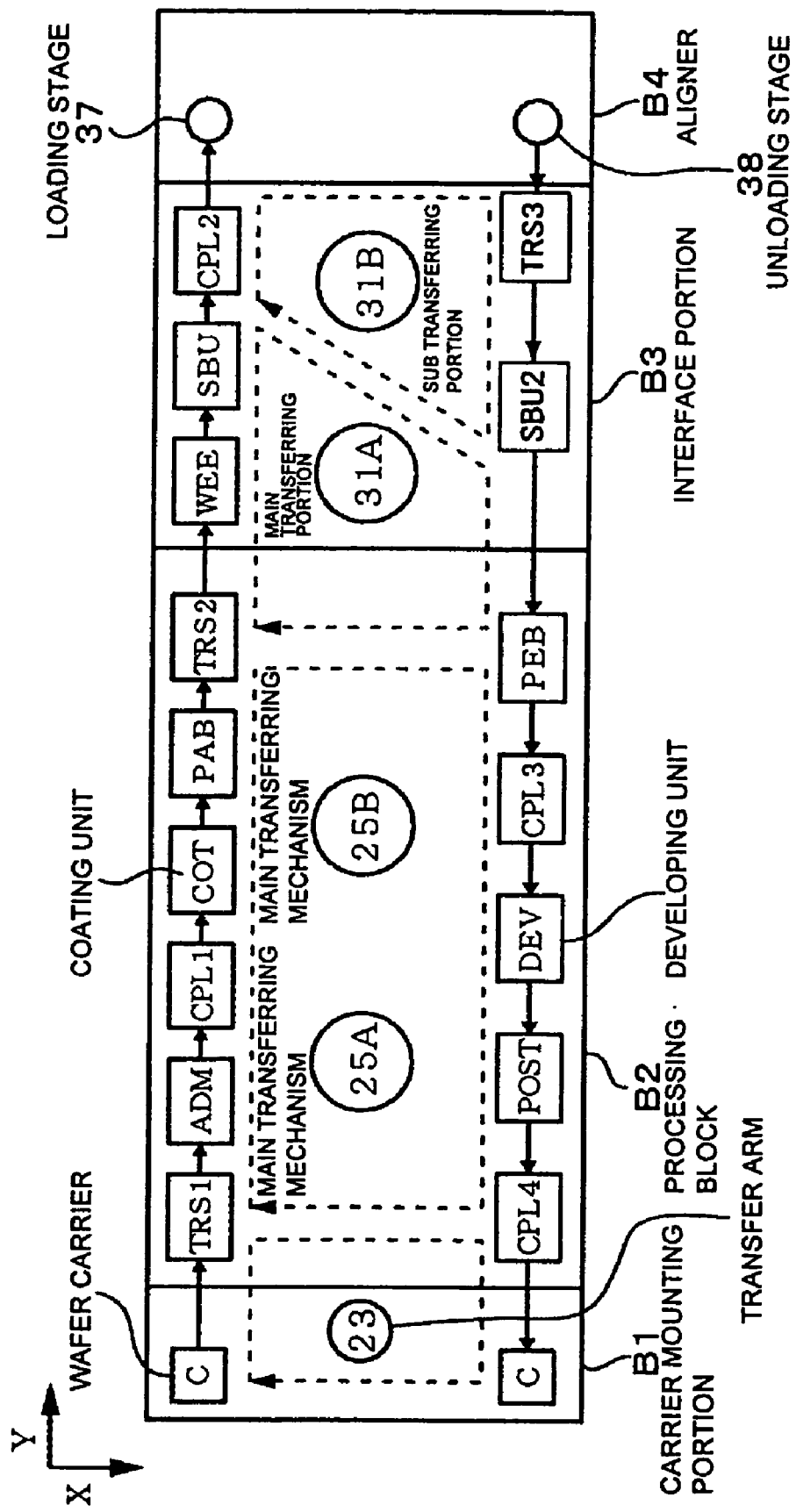
FIG. 20 is a plan view showing a transportation path of a wafer in the coating and developing apparatus according to the other embodiment.

According to this embodiment, a wafer W is left for example on the cooling plate 52 of a heating unit (PEB). However, as shown in FIG. 20, a buffering unit (SUB2) that has the same structure as the buffer cassette (SBU) may be disposed between the aligner B4 and the heating units (PEB) so that the post-exposure delay time TPEB of each wafer W is kept uniform (see FIG. 19). At this point, a wafer W is transferred from the transferring unit (TRS3) to the buffering unit (SUB2) by the main transferring portion 31A. A wafer W is transferred from the buffering unit (SBU2) to the heating unit (PEB) by the main transferring portion 31A. Like the foregoing embodiment, when an exposed wafer W is buffered in the buffering unit (SBU2), the post-exposure delay time $T_{PED}$ of each wafer W can be kept uniform. Thus, when a heating process is performed for exposed wafers W at the same timing, the linewidths of patterns of the wafers W can be prevented from varying.

INDUSTRIAL UTILIZATION

As described above, according to the present invention, after substrates are processed by processing units, wait times until these substrates are processed by the next processing units can be kept uniform for the substrates. In addition, substrates can be prevented from being left stagnant. In the coating and developing apparatus according to the present invention, after substrates are exposed, they are transferred to heating units through an interface portion. In this case, the post-exposure pre-heat times for substrates can be kept uniform. As a result, exposed substrates can be prevented from being left stagnant in the interface portion. Consequently, the performance of the throughput of the aligner can be fulfilled.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A substrate processing system for a substrate processing apparatus having two transferring means, a transfer processing unit, and a plurality of processing units, the transfer processing unit functioning as a transferring portion, the two transferring means transferring a substrate processed by a processing apparatus to the processing units through the transfer processing unit, the system comprising:

n number of transfer processing units that perform a predetermined process for the substrate processed by the processing apparatus where n is any integer that is 2 or larger;

first transferring means for successively executing transportation cycles to successively and individually transfer substrates from modules where the substrates are placed to downstream modules so as to successively and individually take out substrate from the transfer processing units and transfer the substrates to the processing units;

second transferring means for successively and individually transferring substrates processed by the processing apparatus to the transfer processing units; and a controlling portion that controls the first transferring means to successively and individually unload substrates from the transfer processing units after (n−m) cycles including the current transportation cycle have elapsed where m is any integer that is 1 or larger and smaller than n.

2. The substrate processing system as set forth in claim 1, further comprising:

means for adjusting times after the processing apparatus unloads substrates until the transfer processing units start processing the substrates to a predetermined time.

3. A coating and developing apparatus for a substrate processing unit that coats a resist solution on substrates and performs a developing process for substrates that have been exposed by an aligner, the apparatus comprising:

a plurality of processing units that perform a sequence of processes to form a resist film on the substrates;

a plurality of processing units that successively perform a sequence of processes to perform a developing process for substrates that have been exposed;

an interface portion disposed between a region of the group of the processing units that forms the resist film and the group of the processing units that performs the developing process and the aligner;

a first transferring portion that transfers substrates on which the resist film has been formed to the interface portion;

n number of heating units that perform a heating process for exposed substrates and that also function as second transferring portions where n is any integer that is 2 or larger;

a carrier mounting portion that holds a carrier containing a plurality of substrates;

first transferring means for successively and individually receiving substrates from a carrier held on the carrier mounting portion, transferring the substrates to the processing units that form the resist film on the substrates to a first transferring portion, receiving exposed substrates exposed by the aligner from the heating units, transferring the exposed substrates to the processing units that perform the developing process for the exposed substrates and the carrier held on the carrier mounting portion, and successively executing transportation cycles to transfer substrates from modules that are positions at which substrates are placed to downstream modules so as to take out substrate from the transfer processing units and transfer the substrates to the processing units;

second transferring means, disposed in the interface portion, for successively and individually receiving substrates from the first transferring portion, transferring the substrates to the aligner, and transferring substrates exposed by the aligner to the heating units; and a controlling portion that controls the first transferring means to successively and individually unload substrates from the heating units after (n–m) cycles including the current transportation cycle have elapsed where m is any integer that is 1 or larger and smaller than n.

4. The coating and developing apparatus as set forth in claim 3, wherein the each of the heating units has a heating plate that heats a substrate, a cooling plate that cools the substrate heated by the heating plate, and means for transferring the substrate between the heating plate and the cooling plate.

5. The coating and developing apparatus as set forth in claim 3 or 4, further comprising:

means for adjusting times after the aligner unloads substrates until the heating units start performing the heating process for the substrates to a predetermined time.

6. A substrate processing apparatus that is capable of transferring a plurality of substrates with an aligner and performing a predetermined process for the substrates, the apparatus comprising:

a first processing unit that performs a first process for substrates;

a second processing unit that performs a second process for substrates exposed by the aligner, the second process being different from the first process;

a plurality of third processing units that perform a third process for substrates, the third process being different from the first process and the second process;

a first transferring mechanism that transfers substrates among the first processing unit, the second processing unit, and the plurality of third processing units;

a second transferring mechanism that transfers substrates among the aligner and the third processing units; and a controlling portion that independently controls the first transferring mechanism and the second transferring mechanism to transfer substrates, wherein the controlling portion controls the first transferring mechanism to unload substrates from the third processing units before the sum of the number of substrates loaded into the third processing units, the number of substrates currently being transferred by one of the first processing unit, the aligner, and the third processing units, and the number of substrates processed by the first processing unit and the aligner becomes equal to the number of the third processing units.

7. A substrate processing apparatus that is capable of transferring a plurality of substrates with an aligner and performing a predetermined process for the substrates, the apparatus comprising:

a first processing unit that performs a first process for substrates;

a second processing unit that performs a second process for substrates exposed by the aligner, the second process being different from the first process;

a plurality of third processing units that perform a third process for substrates, the third process being different from the first process and the second process;

a first transferring mechanism that transfers substrates among the first processing unit, the second processing unit, and the plurality of third processing units;

a second transferring mechanism that transfers substrates among the aligner and the third processing units; and a controlling portion that independently controls the first transferring mechanism and the second transferring mechanism to transfer substrates, wherein the second transferring mechanism has:

a main transferring mechanism capable of transferring substrates to the third processing units; and a sub transferring mechanism capable of receiving substrates exposed by the aligner, and wherein the controlling portion independently controls the main transferring mechanism and the sub transferring mechanism to transfer the substrates.

8. A substrate processing apparatus that is capable of transferring a plurality of substrates with an aligner and performing a predetermined process for the substrates, the apparatus comprising:

a first processing unit that performs a first process for substrates;

a second processing unit that performs a second process for substrates exposed by the aligner, the second process being different from the first process;

a plurality of third processing units that perform a third process for substrates, the third process being different from the first process and the second process;

a first transferring mechanism that transfers substrates among the first processing unit, the second processing unit, and the plurality of third processing units;

a second transferring mechanism that transfers substrates among the aligner and the third processing units;

a controlling portion that independently controls the first transferring mechanism and the second transferring mechanism to transfer substrates; and means for controlling wait times after the aligner exposes substrates until the third processing units start performing the third process for the substrates to keep them uniform.

9. The substrate processing apparatus as set forth in claim 8, wherein the wait times are times of which real transportation times after the aligner exposes substrates until the substrates are transferred to the third processing units are subtracted from the sum of the maximum value of times after the aligner exposes the substrates until the substrates are received by the second transferring mechanism and the minimum value of times after the second transporting mechanism receives the exposed substrates until the substrates are transferred to the third processing unit.

10. The substrate processing apparatus as set forth in claim 7, wherein at least one of the main transferring mechanism and the sub transferring mechanism has:

a first transferring member that transfers substrates; and a second transferring member that is movable integrally with the first transferring member and that is capable of transferring the substrates.

11. A substrate processing apparatus that is capable of transferring a plurality of substrates with an aligner and performing a predetermined process for the substrates, the apparatus comprising:

a first processing unit that performs a first process for substrates;

a second processing unit that performs a second process for substrates exposed by the aligner, the second process being different from the first process;

a plurality of third processing units that perform a third process for substrates, the third process being different from the first process and the second process;

a first transferring mechanism that transfers substrates among the first processing unit, the second processing unit, and the plurality of third processing units;

a second transferring mechanism that transfers substrates among the aligner and the third processing units;

a controlling portion that independently controls the first transferring mechanism and the second transferring mechanism to transfer substrates; and a buffering unit that is disposed between the aligner and the third processing units and that buffers substrates to keep times after the aligner exposes substrates until the third processing units start performing the third process for the substrates to be uniform.

* * * * *